United States Patent
Ohno et al.

(10) Patent No.: US 10,872,982 B2
(45) Date of Patent: *Dec. 22, 2020

(54) SEMICONDUCTOR DEVICE AND METHOD FOR MANUFACTURING THE SAME

(71) Applicant: Semiconductor Energy laboratory Co., Ltd., Atsugi (JP)

(72) Inventors: Shinji Ohno, Kanagawa (JP); Hirokazu Watanabe, Kanagawa (JP); Naoto Kusumoto, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/045,298

(22) Filed: Feb. 17, 2016

(65) Prior Publication Data

US 2016/0163880 A1 Jun. 9, 2016

Related U.S. Application Data

(62) Division of application No. 13/775,408, filed on Feb. 25, 2013, now abandoned.

(30) Foreign Application Priority Data

Feb. 28, 2012 (JP) ................. 2012-040837

(51) Int. Cl.
*H01L 29/786* (2006.01)
*H01L 29/66* (2006.01)
(Continued)

(52) U.S. Cl.
CPC ...... *H01L 29/78693* (2013.01); *H01L 21/425* (2013.01); *H01L 29/247* (2013.01);
(Continued)

(58) Field of Classification Search
CPC ......... H01L 29/78693; H01L 29/78696; H01L 29/247; H01L 29/7869; H01L 29/66969; H01L 21/245

See application file for complete search history.

(56) References Cited

U.S. PATENT DOCUMENTS 5,581,092 A 12/1996 Takemura
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Machine translation of JP H11-243212.*
(Continued)

*Primary Examiner* — Vincent Wall
(74) *Attorney, Agent, or Firm* — Fish & Richardson P.C.

(57) ABSTRACT

A transistor excellent in electrical characteristics and a method for manufacturing the transistor are provided. The transistor includes an oxide semiconductor layer including a source region, a drain region, and a channel formation region over an insulating surface; a gate insulating film over the oxide semiconductor layer; a gate electrode overlapping with the channel formation region, over the gate insulating film; a source electrode in contact with the source region; and a drain electrode in contact with the drain region. The source region and the drain region include a portion having higher oxygen concentration than the channel formation region.

4 Claims, 16 Drawing Sheets

(51) Int. Cl.
H01L 21/425 (2006.01)
H01L 29/24 (2006.01)
(52) U.S. Cl.
CPC .... H01L 29/66969 (2013.01); H01L 29/7869 (2013.01); H01L 29/78696 (2013.01)

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,598,520 B2 * | 10/2009 | Hirao | H01L 29/7869 257/352 |
| 7,674,650 B2 | 3/2010 | Akimoto et al. | |
| 7,696,024 B2 * | 4/2010 | Maruyama | H01L 29/66757 438/151 |
| 7,732,819 B2 | 6/2010 | Akimoto et al. | |
| 7,993,964 B2 | 8/2011 | Hirao et al. | |
| 7,994,500 B2 | 8/2011 | Kim et al. | |
| 8,049,225 B2 | 11/2011 | Yamazaki et al. | |
| 8,148,779 B2 | 4/2012 | Jeong et al. | |
| 8,188,480 B2 | 5/2012 | Itai | |
| 8,202,365 B2 | 6/2012 | Umeda et al. | |
| 8,203,143 B2 | 6/2012 | Imai | |
| 8,772,768 B2 * | 7/2014 | Yamazaki | H01L 21/02554 257/43 |
| 9,287,407 B2 * | 3/2016 | Koezuka | H01L 29/78618 |
| 9,768,307 B2 * | 9/2017 | Yamazaki | H01L 29/7869 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 * | 3/2006 | Hoffman | H01L 29/7869 257/72 |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0206332 A1 * | 8/2009 | Son | H01L 29/42384 257/43 |
| 2009/0278122 A1 | 11/2009 | Hosono et al. | |
| 2009/0280600 A1 | 11/2009 | Hosono et al. | |
| 2009/0283763 A1 * | 11/2009 | Park | H01L 29/78621 257/43 |
| 2010/0013747 A1 * | 1/2010 | Honda | G09G 3/3233 345/76 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0320458 A1 | 12/2010 | Umeda et al. | |
| 2010/0320459 A1 | 12/2010 | Umeda et al. | |
| 2011/0003429 A1 * | 1/2011 | Oikawa | H01L 29/7869 438/104 |
| 2011/0042670 A1 * | 2/2011 | Sato | H01L 29/7869 257/43 |
| 2011/0147738 A1 * | 6/2011 | Yamazaki | H01L 21/425 257/43 |
| 2011/0193083 A1 | 8/2011 | Kim et al. | |
| 2011/0215328 A1 | 9/2011 | Morosawa et al. | |
| 2011/0260171 A1 | 10/2011 | Yamazaki | |
| 2011/0263082 A1 | 10/2011 | Yamazaki | |
| 2011/0263083 A1 | 10/2011 | Yamazaki | |
| 2011/0263084 A1 | 10/2011 | Yamazaki | |
| 2011/0263085 A1 | 10/2011 | Yamazaki | |
| 2011/0263091 A1 | 10/2011 | Yamazaki | |
| 2011/0281394 A1 | 11/2011 | Yamazaki | |
| 2011/0284848 A1 | 11/2011 | Yamazaki | |
| 2012/0161121 A1 * | 6/2012 | Yamazaki | H01L 29/78621 257/43 |
| 2012/0280234 A1 | 11/2012 | Koezuka et al. | |
| 2012/0315735 A1 * | 12/2012 | Koezuka | H01L 29/7869 438/301 |
| 2012/0319102 A1 * | 12/2012 | Yamazaki | H01L 29/7869 257/43 |
| 2013/0164899 A1 | 6/2013 | Koezuka et al. | |
| 2013/0164920 A1 | 6/2013 | Yamazaki | |

(56) References Cited

U.S. PATENT DOCUMENTS

| | | |
|---|---|---|
| 2013/0175530 A1 | 7/2013 | Noda et al. |
| 2013/0187150 A1 | 7/2013 | Yamazaki et al. |
| 2013/0187153 A1 | 7/2013 | Yamazaki et al. |
| 2013/0193493 A1 | 8/2013 | Yamazaki |
| 2013/0196468 A1 | 8/2013 | Yamazaki |
| 2013/0200365 A1 | 8/2013 | Yamazaki |
| 2013/0200375 A1 | 8/2013 | Yamazaki |
| 2013/0203214 A1 | 8/2013 | Isobe et al. |

FOREIGN PATENT DOCUMENTS

| | | | |
|---|---|---|---|
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |
| JP | 11-505377 | 5/1999 | |
| JP | 11-243212 A | 9/1999 | |
| JP | H11-243212 | * 9/1999 | ........... H01L 29/786 |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2006-165528 A | 6/2006 | |
| JP | 2007-073705 A | 3/2007 | |
| JP | 2007-220816 A | 8/2007 | |
| JP | 2009-528670 | 8/2009 | |
| JP | 2009-231613 A | 10/2009 | |
| JP | 2010-016347 A | 1/2010 | |
| JP | 4415062 | 2/2010 | |
| JP | 2010-067954 A | 3/2010 | |
| JP | 2010-177431 A | 8/2010 | |
| JP | 4571221 | 10/2010 | |
| JP | 2011-159697 A | 8/2011 | |
| WO | WO-2004/114391 | 12/2004 | |
| WO | WO-2007/142167 | 12/2007 | |
| WO | WO-2008/133345 | 11/2008 | |

OTHER PUBLICATIONS

Vijayakumar et al., "Effects of ion implantation in spray-pyrolyzed ZNO thin films", phys. stat. sol. (1) 203, No. 5, 860-867 (2006).*

Cheung, N.W., "Plasma immersion ion implantation for semiconductor processing", Materials Chemistry and Physics 46 (1996) 132-139, Feb. 11, 1996 (Year: 1996).*

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced At Room Temperature", Appl. Phys. Lett. "Applied Physics Letters" , Sep. 27, 2004, vol. 85, No. 13, pp. 2531-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al.,"42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States ", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Laer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

(56) References Cited

OTHER PUBLICATIONS

Kim.S et al., "High-Performance oxide thin film transistors passivated by various gas plasmas", 214th ECS Meeting, 2008, No. 2317, ECS.
Kimizuka.N et al., "Spinel,YBFE2O4, and YB2FE3O7 Types of Structures for Compounds in the In2O3 and SC2O3—A2O3—BO Systems [A; FE, GA, or Al;B:Mg, Mn, Fe, Ni, Cu,or Zn] at Temperatures over 1000 ° C. ", Journal of Solid State Chemistry, 1985, vol. 60, pp. 382-384.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp.4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191- 194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

(56) References Cited

OTHER PUBLICATIONS

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Fischer.H et al., "Radiation Damage in Ion-Implanted Quartz Crystals", Phys. Stat. Sol. (A) (Physica Status Solidi. A.), 1983, vol. 76, No. 1, pp. 249-256.

\* cited by examiner

FIG. 13A Model A
FIG. 13B Model B
FIG. 13C Model C
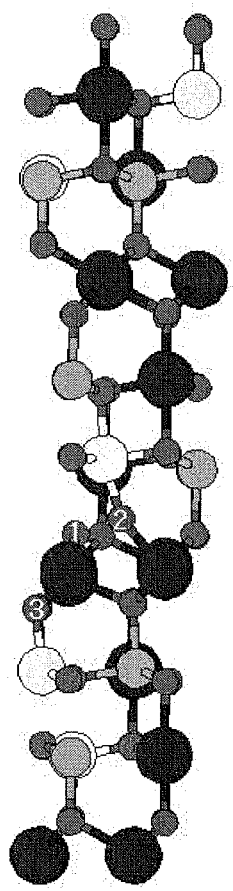
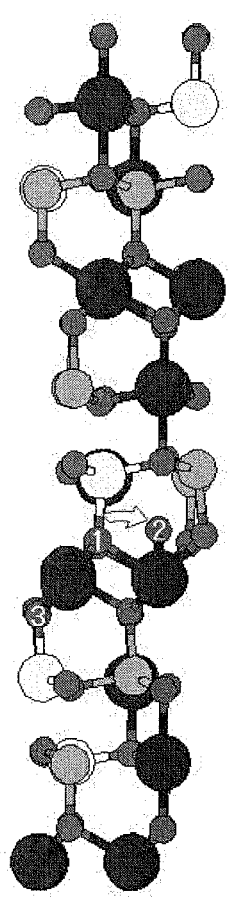
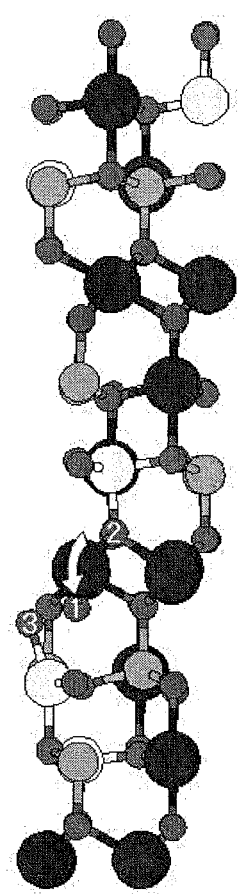
legend symbol
In: ● Ga: ○ Zn: ● O: ●

Model A

Model B

Model C legend symbol

In: ● Ga: ○ Zn: ● O: ●

SEMICONDUCTOR DEVICE AND METHOD FOR MANUFACTURING THE SAME

CROSS-REFERENCE TO RELATED APPLICATIONS

This application is a divisional of U.S. application Ser. No. 13/775,408, filed Feb. 25, 2013, now pending, which claims the benefit of a foreign priority application filed in Japan as Serial No. 2012-040837 on Feb. 28, 2012, both of which are incorporated by reference.

BACKGROUND OF THE INVENTION

1. Field of the Invention

The present invention relates to a semiconductor device and a method for manufacturing the semiconductor device.

Note that in this specification, a semiconductor device refers to any device that can function by utilizing semiconductor characteristics, and an electro-optical device, a semiconductor circuit, and an electronic device are all included in the category of semiconductor devices.

2. Description of the Related Art

Attention has been focused on a technique for forming a transistor using a semiconductor thin film formed over a substrate having an insulating surface (also referred to as thin film transistor (TFT)). The transistor is applied to a wide range of electronic devices such as an integrated circuit (IC) and an image display device (display device). A silicon-based semiconductor material is widely known as a material for a semiconductor thin film applicable to a transistor. As another material, an oxide semiconductor material has been attracting attention.

For example, a transistor whose active layer includes an amorphous oxide semiconductor containing indium (In), gallium (Ga), and zinc (Zn) is disclosed (see Patent Document 1).

REFERENCE

Patent Document

Patent Document 1 Japanese Published Patent Application No. 2006-165528

SUMMARY OF THE INVENTION

It is known that oxygen vacancy in an oxide semiconductor and hydrogen contained therein as an impurity serve as donors; thus, in the case where an oxide semiconductor is used for a channel formation region of a transistor, an oxide semiconductor layer having as little oxygen vacancy, hydrogen, and moisture as possible is preferably used. However, oxygen is desorbed from the oxide semiconductor layer through heat treatment performed as dehydration or dehydrogenation treatment on the oxide semiconductor layer or an insulating film in contact with the oxide semiconductor layer.

Desorption of oxygen from the oxide semiconductor layer becomes a factor of a change in electrical characteristics of a transistor, and thus oxygen vacancy due to desorption of oxygen from the oxide semiconductor layer needs to be filled. For that reason, development of a method for efficiently supplying oxygen to the oxide semiconductor layer has been required.

In view of this, an object of one embodiment of the present invention is to provide a transistor in which oxygen is efficiently supplied to a channel formation region and which has excellent electrical characteristics. Another object is to provide a method for manufacturing the transistor.

One embodiment of the present invention disclosed in this specification relates to a transistor in which the oxygen concentration in a source region and a drain region is higher than that in a channel formation region, and relates to a method for manufacturing the transistor.

One embodiment of the present invention disclosed in this specification is a semiconductor device including an oxide semiconductor layer including a source region, a drain region, and a channel formation region over an insulating surface; a gate insulating film over the oxide semiconductor layer; a gate electrode overlapping with the channel formation region, over the gate insulating film; a source electrode in contact with the source region; and a drain electrode in contact with the drain region. The source region and the drain region include a portion having higher oxygen concentration than the channel formation region.

In the oxide semiconductor layer, the channel formation region preferably includes a c-axis aligned crystal, and the portion which is in the source region and the drain region and has higher oxygen concentration than the channel formation region is preferably amorphous.

An impurity for improving conductivity of the oxide semiconductor layer is preferably added to the portion which is in the source region and the drain region and has higher oxygen concentration than the channel formation region.

At least one of the gate electrode, the source electrode, and the drain electrode may be electrically connected to a semiconductor device including a semiconductor layer whose band gap is different from a band gap of the oxide semiconductor layer.

An insulating film containing aluminum oxide is preferably formed over the gate insulating film and the gate electrode.

Another embodiment of the present invention disclosed in this specification is a method for manufacturing a semiconductor device, including the sequential steps of preparing a substrate having an insulating surface; forming an oxide semiconductor layer over the insulating surface; forming a gate insulating film over the oxide semiconductor layer; forming a gate electrode over the gate insulating film so as to overlap with the oxide semiconductor layer; adding oxygen to a region which is in the oxide semiconductor layer and does not overlap with the gate electrode; adding an impurity to the region which is in the oxide semiconductor layer and does not overlap with the gate electrode to form a source region, a drain region, and a channel formation region; forming an insulating film over the gate insulating film and the gate electrode; performing heat treatment on the oxide semiconductor layer; and forming a source electrode in contact with the source region and a drain electrode in contact with the drain region.

Another embodiment of the present invention disclosed in this specification is a method for manufacturing a semiconductor device, including the sequential steps of preparing a substrate having an insulating surface; forming an oxide semiconductor layer over the insulating surface; forming a source electrode and a drain electrode in contact with the oxide semiconductor layer; forming a gate insulating film over the oxide semiconductor layer, the source electrode, and the drain electrode; forming a gate electrode over the gate insulating film so as to overlap with the oxide semiconductor layer; adding oxygen to a region which is in the oxide semiconductor layer and does not overlap with the gate electrode, the source electrode, or the drain electrode;

adding an impurity to the region which is in the oxide semiconductor layer and does not overlap with the gate electrode, the source electrode, or the drain electrode to form a source region, a drain region, and a channel formation region; forming an insulating film over the gate insulating film and the gate electrode; and performing heat treatment on the oxide semiconductor layer.

In the two methods for manufacturing the semiconductor device, the step of adding the impurity to the oxide semiconductor layer may be performed before the step of adding oxygen to the oxide semiconductor layer, after the step of forming the insulating film, or after the step of performing the heat treatment on the oxide semiconductor layer.

Another embodiment of the present invention disclosed in this specification is a method for manufacturing a semiconductor device, including the steps of preparing a substrate having an insulating surface; forming a source electrode and a drain electrode over the insulating surface; forming an oxide semiconductor layer in contact with the source electrode and the drain electrode; forming a gate insulating film over the source electrode, the drain electrode, and the oxide semiconductor layer; forming a gate electrode over the gate insulating film so as to overlap with part of the source electrode, part of the drain electrode, and part of the oxide semiconductor layer; adding oxygen to a region which is in the oxide semiconductor layer and does not overlap with the gate electrode; forming an insulating film over the gate insulating film and the gate electrode; and performing heat treatment on the oxide semiconductor layer.

In any of the methods for manufacturing the semiconductor device, the insulating film is preferably an insulating film containing aluminum oxide.

According to one embodiment of the present invention, a transistor in which oxygen can be efficiently supplied to a channel formation region and which has excellent electrical characteristics can be provided.

BRIEF DESCRIPTION OF THE DRAWINGS

FIGS. 13A to 13C are model diagrams used for calculation of movement of excessive oxygen.

DETAILED DESCRIPTION OF THE INVENTION

Figure 1A:
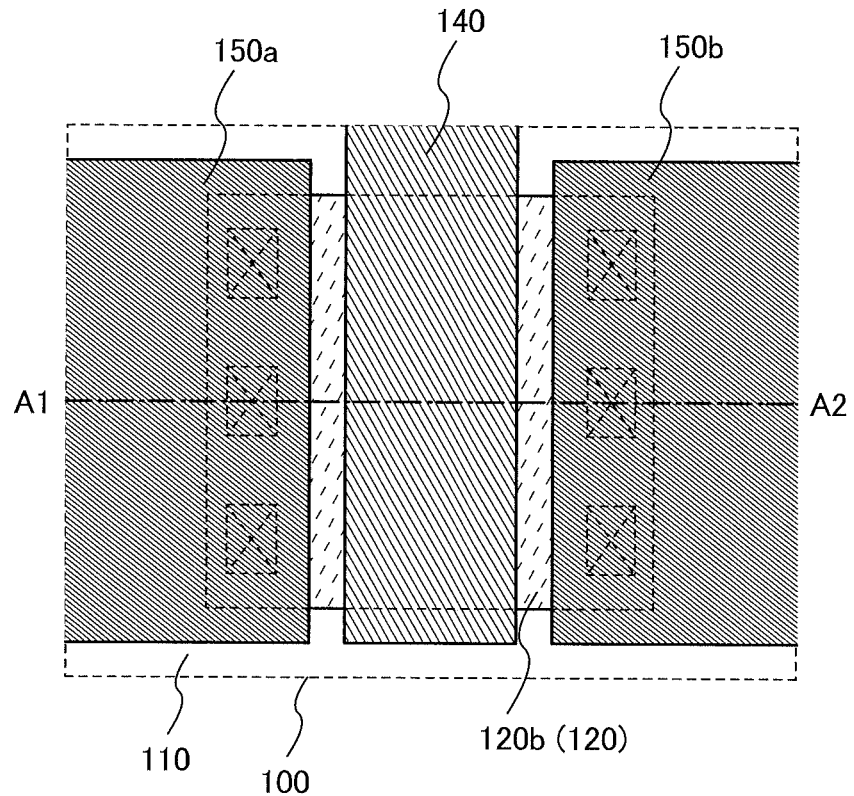
FIGS. 1A and 1B are a top view and a cross-sectional view illustrating a semiconductor device according to one embodiment of the present invention.

Embodiments of the present invention will be described in detail with reference to the accompanying drawings. Note that the present invention is not limited to the following description and it will be readily appreciated by those skilled in the art that modes and details can be modified in various ways without departing from the spirit and scope of the present invention. The present invention therefore should not be construed as being limited to the following description in the embodiments. Note that in structures of the present invention described below, the same portions or portions having similar functions are denoted by the same reference numerals in different drawings, and description thereof is not repeated in some cases.

Embodiment 1

In this embodiment, a semiconductor device according to one embodiment of the present invention and a method for manufacturing the semiconductor device will be described.

Figure 1B:
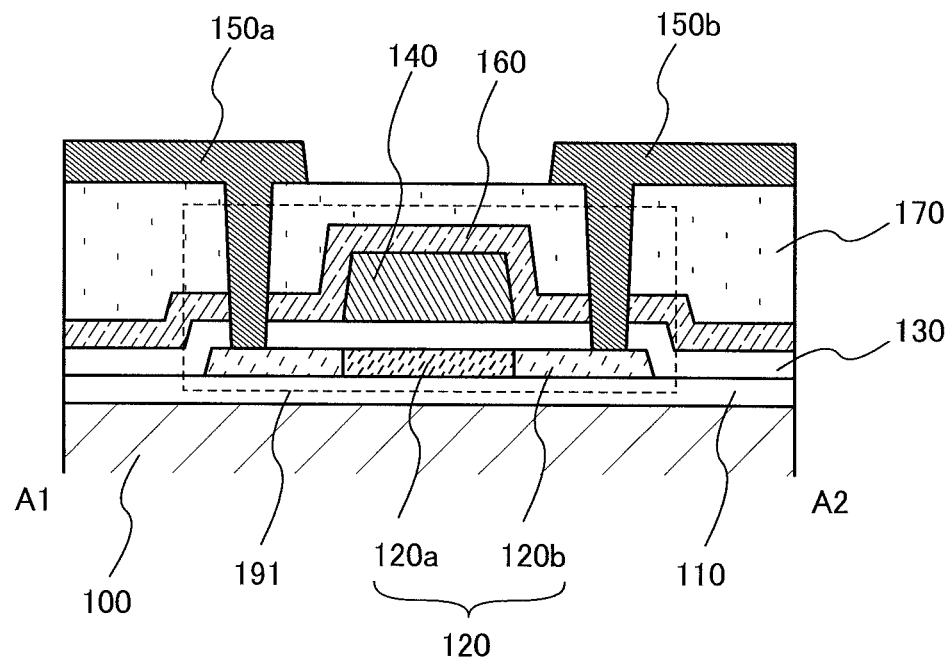

FIG. 1A is a top view of a transistor according to one embodiment of the present invention, and FIG. 1B is a cross-sectional view taken along line A1-A2 in FIG. 1A. Note that some components are not illustrated in FIG. 1A for simplicity.

A transistor 191 in FIGS. 1A and 1B includes a base insulating film 110 formed over a substrate 100; an oxide semiconductor layer 120 formed over the base insulating film; a gate insulating film 130 formed over the oxide semiconductor layer; a gate electrode 140 formed over the gate insulating film; a protective film 160 formed over the gate insulating film and the gate electrode; a planarization film 170 formed over the protective film; and a source electrode 150a and a drain electrode 150b in contact with the oxide semiconductor layer through contact holes formed in the protective film and the planarization film. Note that the protective film 160 and the planarization film 170 may be provided as needed.

FIGS. 1A and 1B illustrate an example of a self-aligned top-gate transistor that can be used in one embodiment of the present invention; the kinds, shapes, and positional relationships of components are not limited to those illustrated in FIGS. 1A and 1B.

Functions of a "source" and a "drain" of a transistor are sometimes replaced with each other when a transistor of opposite polarity is used or when the direction of current flowing is changed in circuit operation, for example. Therefore, the terms "source" and "drain" can be used to denote the drain and the source, respectively, in this specification.

The substrate 100 is not limited to a simple supporting substrate, and may be a substrate where a device such as a transistor is formed. In this case, at least one of the gate electrode 140, the source electrode 150a, and the drain electrode 150b of the transistor 191 may be electrically connected to the device.

The base insulating film 110 can have a function of supplying oxygen to the oxide semiconductor layer 120 as well as a function of preventing diffusion of an impurity from the substrate 100; thus, the base insulating film 110 is preferably an insulating film containing oxygen. Note that in the case where the substrate 100 is a substrate where another device is formed as described above, the base insulating film 110 has also a function as an interlayer insulating film. In that case, the base insulating film 110 is preferably subjected to planarization treatment such as chemical mechanical polishing (CMP) treatment so as to have a flat surface.

The oxide semiconductor layer 120 is processed into an island shape, and overlaps with the gate electrode 140 with the gate insulating film 130 therebetween. In the oxide semiconductor layer 120, a region which overlaps with the gate electrode 140 is a channel formation region 120a, and a region which does not overlap with the gate electrode 140 is a source region or drain region 120b.

The channel formation region 120a is formed using an oxide semiconductor including crystals with c-axis alignment. Here, the crystals with c-axis alignment mean crystals whose c-axes of crystal axes are aligned in the direction parallel to a normal vector of a surface where the film is formed or a normal vector of a surface of the film.

On the other hand, the source region or drain region 120b is amorphous. The amorphous source region or drain region 120b includes a large number of defects and the like serving as gettering sites, and thus can getter hydrogen, moisture, and the like in the channel formation region 120a, the base insulating film 110, and the gate insulating film 130. Further, the amorphous source region or drain region 120b can getter hydrogen, moisture, and the like which are to enter the channel formation region 120a in the manufacturing process or operation of the transistor.

Here, the source region or drain region 120b contains a larger amount of oxygen than the channel formation region 120a. When excessive oxygen in the source region or drain region 120b is diffused into the channel formation region 120a, oxygen vacancies and the like in the channel formation region 120a which are caused owing to a heating step or the like in the manufacturing process of the transistor can be filled. Further, oxygen vacancies and the like in the channel formation region 120a which are caused owing to long-time operation or operation environment of the transistor can also be filled.

In the channel formation region 120a formed using an oxide semiconductor including crystals with c-axis alignment, oxygen atoms easily move in the horizontal direction (direction substantially perpendicular to the c-axes); thus, oxygen can be efficiently diffused from the direction of the source region or drain region 120b to the channel formation region 120a. Note that the channel formation region 120a is preferably in an oxygen-excess state where the oxygen content is in excess of that in the stoichiometric composition.

An impurity for improving the conductivity of the oxide semiconductor layer is preferably added to the source region or drain region 120b. As the impurity, for example, one or more selected from the following can be used: phosphorus (P), arsenic (As), antimony (Sb), boron (B), aluminum (Al), nitrogen (N), argon (Ar), helium (He), neon (Ne), indium (In), fluorine (F), chlorine (Cl), titanium (Ti), zinc (Zn), and carbon (C).

Over the gate insulating film 130 and the gate electrode 140, an insulating film containing aluminum oxide is preferably formed as the protective film 160. The aluminum oxide film has a high blocking effect of preventing penetration of both oxygen and an impurity such as hydrogen or moisture. Accordingly, the aluminum oxide film can be suitably used as a protective film that prevents entry of an impurity such as hydrogen or moisture, which causes variation in the electric characteristics of the transistor, into the oxide semiconductor layer 120 and release of oxygen, which is a main component material of the oxide semiconductor layer 120, from the oxide semiconductor layer during and after the manufacturing process. Note that another insulating film may be formed between the protective film 160, and the gate insulating film 130 and the gate electrode 140.

Figure 2A:
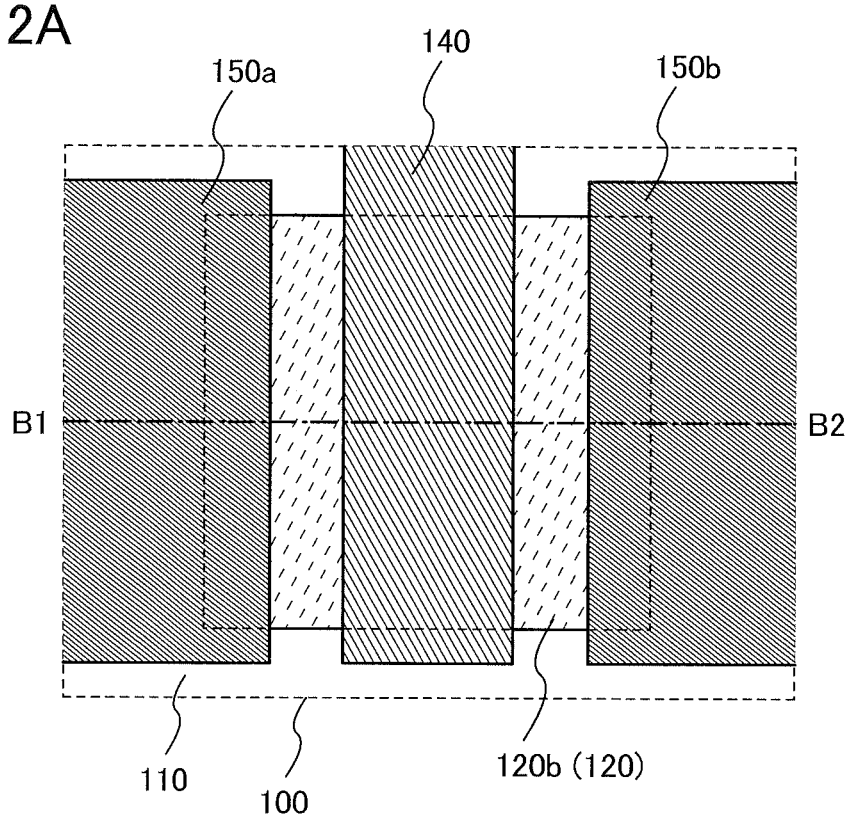
FIGS. 2A and 2B are a top view and a cross-sectional view illustrating a semiconductor device according to one embodiment of the present invention.
Figure 2B:
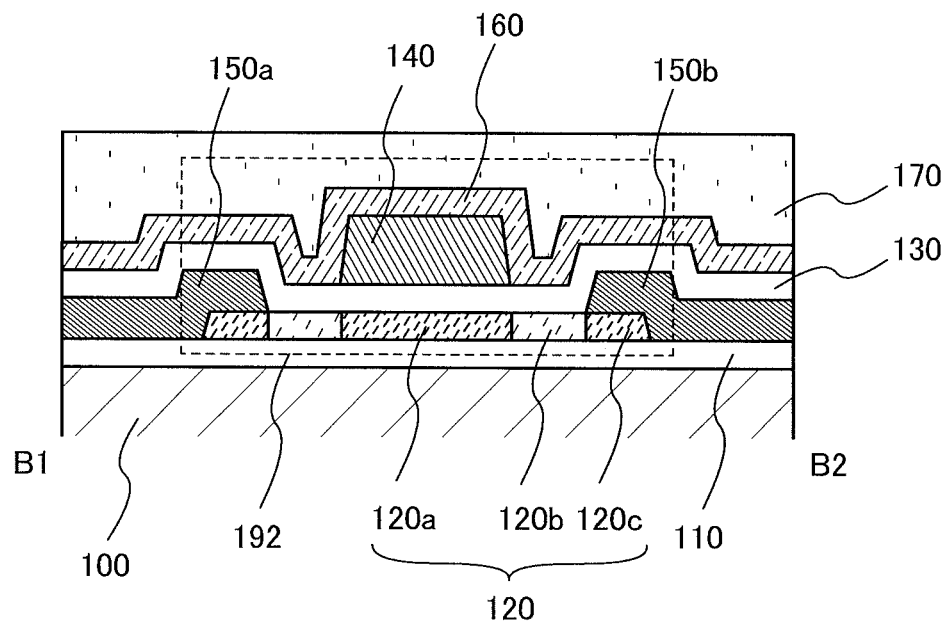

Note that a transistor that can be used in one embodiment of the present invention may have a structure illustrated in FIGS. 2A and 2B.

FIG. 2A is a top view of a transistor, and FIG. 2B is a cross-sectional view taken along line B1-B2 in FIG. 2A. Note that some components are not illustrated in FIG. 2A for simplicity.

A transistor 192 in FIGS. 2A and 2B includes the base insulating film 110 formed over the substrate 100; the oxide semiconductor layer 120 formed over the base insulating film; the source electrode 150a and the drain electrode 150b formed in contact with the oxide semiconductor layer; the gate insulating film 130 formed over the oxide semiconductor layer, and the source electrode and the drain electrode; the gate electrode 140 formed over the gate insulating film; the protective film 160 formed over the gate insulating film and the gate electrode; and the planarization film 170 formed over the protective film. Note that the protective film 160 and the planarization film 170 may be provided as needed.

The transistor 192 is different from the transistor 191 in the positions of the source electrode 150a and the drain electrode 150b. Accordingly, in the oxide semiconductor layer 120, a region 120c is formed in addition to the channel formation region 120a and the source region or drain region 120b.

The source region or drain region 120b is formed by addition of oxygen or an impurity for improving conductivity by an ion implantation method or the like after the formation of the gate electrode 140. In the transistor 191, the gate electrode 140 serves as a mask; thus, the impurity for improving the conductivity is added to regions in the oxide semiconductor layer 120 which do not overlap with the gate electrode 140, so that the source region or drain region 120b is formed. On the other hand, in the transistor 192, the source electrode 150a and the drain electrode 150b also serve as masks, so that the region 120c is formed in the oxide semiconductor layer 120.

Although the impurity for improving the conductivity is not added to the region 120c as well as to the channel formation region 120a, the resistance of the region 120c is negligible because the region 120c is in contact with a metal material of the source electrode 150a and the drain electrode 150b. Therefore, it can be said that the region 120c is part of the source region or drain region.

Figure 3A:
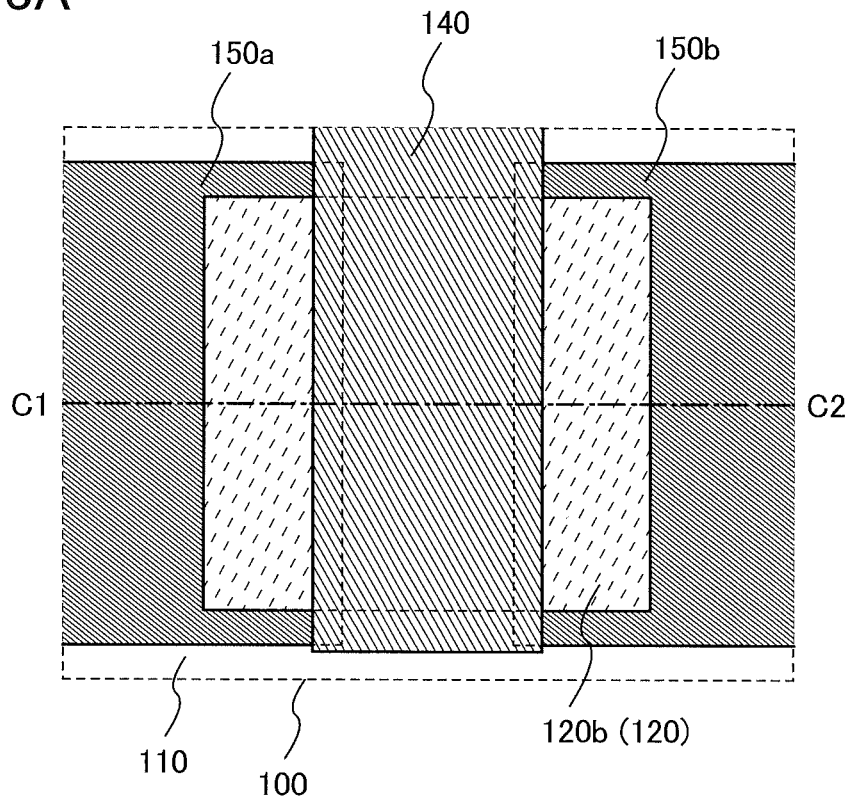
FIGS. 3A and 3B are a top view and a cross-sectional view illustrating a semiconductor device according to one embodiment of the present invention.
Figure 3B:
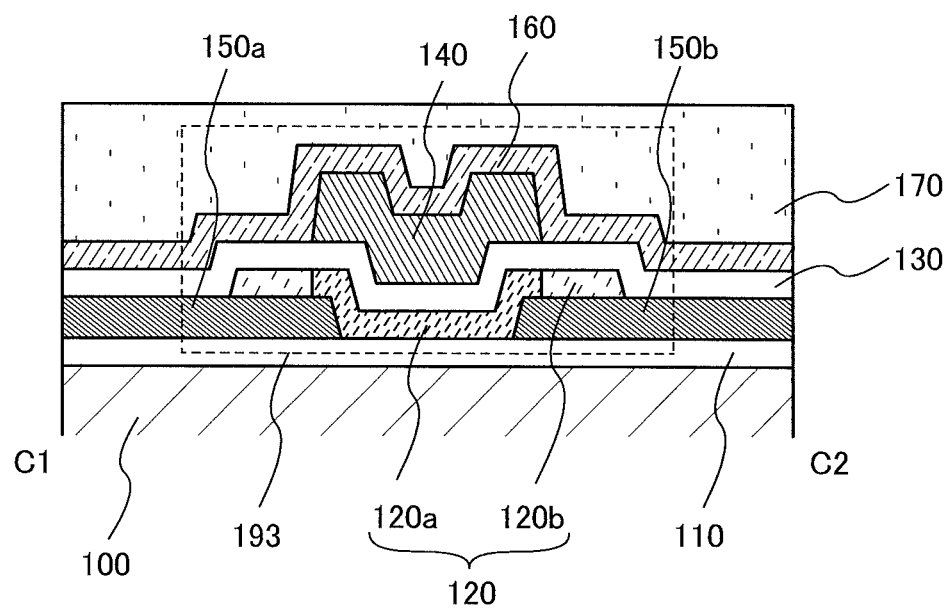

Note that a transistor that can be used in one embodiment of the present invention may have a structure illustrated in FIGS. 3A and 3B.

FIG. 3A is a top view of a transistor, and FIG. 3B is a cross-sectional view taken along line C1-C2 in FIG. 3A. Note that some components are not illustrated in FIG. 3A for simplicity.

A transistor 193 in FIGS. 3A and 3B includes the base insulating film 110 formed over the substrate 100; the source electrode 150a and the drain electrode 150b formed over the base insulating film; the oxide semiconductor layer 120 formed in contact with the source electrode and the drain electrode; the gate insulating film 130 formed over the source electrode, the drain electrode, and the oxide semiconductor layer 120; the gate electrode 140 formed over the gate insulating film; the protective film 160 formed over the gate insulating film and the gate electrode; and the planarization film 170 formed over the protective film. Note that the protective film 160 and the planarization film 170 may be provided as needed.

The transistor 193 is different from the transistor 191 and the transistor 192 in that the source electrode 150a and the drain electrode 150b partly overlap with the gate electrode 140. Accordingly, the channel formation region 120a is in contact with the source electrode 150a and the drain electrode 150b; thus, a step of adding an impurity to the source region or drain region 120b for lowering resistance thereof may be skipped.

Next, a method for manufacturing the transistor 191 in FIGS. 1A and 1B will be described with reference to FIGS. 4A to 4D.

First, the base insulating film 110 is formed over the substrate 100. There is no particular limitation on a material for the substrate 100 as long as it withstands a heating step performed later. For example, an insulating substrate such as a glass substrate, a semiconductor substrate such as a silicon wafer, or the like can be used. Alternatively, a substrate where another device is formed may be used as described above.

The base insulating film 110 can be formed by a plasma CVD method, a sputtering method, or the like using an oxide insulating film of silicon oxide, silicon oxynitride, aluminum oxide, aluminum oxynitride, hafnium oxide, gallium oxide, or the like; a nitride insulating film of silicon nitride, silicon nitride oxide, aluminum nitride, aluminum nitride oxide, or the like; or a mixed material of any of these. Further, a layered structure including any of the above materials may be employed for the base insulating film 110; in that case, at least an upper layer in contact with the oxide semiconductor layer 120 is preferably formed using a material containing oxygen so that oxygen can be supplied therefrom to the oxide semiconductor layer 120.

Figure 4A:
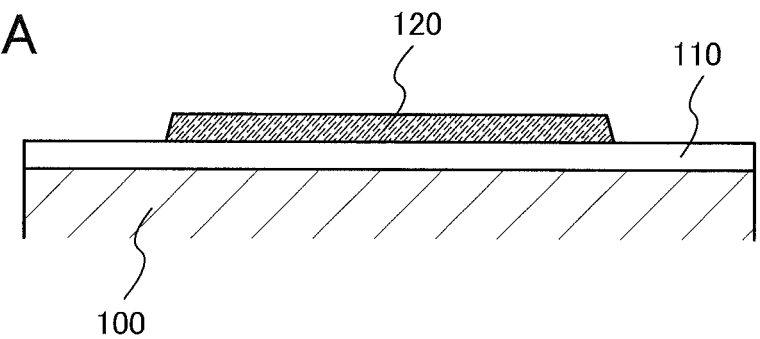
FIGS. 4A to 4D illustrate a method for manufacturing a semiconductor device according to one embodiment of the present invention.

Next, an oxide semiconductor film is formed over the base insulating film 110 and then processed into an island shaped by a photolithography method and an etching method to form the oxide semiconductor layer 120 (see FIG. 4A).

After the oxide semiconductor film is formed, heat treatment for reducing or removing excess hydrogen (including water and a hydroxyl group) in the oxide semiconductor film (dehydration or dehydrogenation) is preferably performed. The temperature of the heat treatment is higher than or equal to 300° C. and lower than or equal to 700° C. In the case where a glass substrate is used as the substrate 100, the temperature of the heat treatment is lower than the strain point of the substrate. The heat treatment is preferably performed under reduced pressure, an atmosphere of an inert gas such as nitrogen or a rare gas, or an atmosphere containing oxygen.

The heat treatment enables hydrogen, which is an impurity imparting n-type conductivity, in the oxide semiconductor film to be reduced or removed. Further, in the case where an insulating layer containing oxygen is used as the base insulating film 110, by this heat treatment, oxygen contained in the base insulating film 110 can be supplied to the oxide semiconductor film. By supplying oxygen from the base insulating film 110, oxygen vacancies in the oxide semiconductor film increased by the dehydration or dehydrogenation treatment can be filled.

The heat treatment for the dehydration or dehydrogenation may be performed after the island-shaped oxide semiconductor layer 120 is formed. Further, the heat treatment for the dehydration or dehydrogenation may serve as another heat treatment in the manufacturing process of the transistor.

Note that it is preferable that in the heat treatment, moisture, hydrogen, and the like be not contained in nitrogen, oxygen, or a rare gas such as helium, neon, or argon. It is also preferable that the purity of the above gas be set to 6N (99.9999%) or higher, preferably 7N (99.99999%) or higher (that is, the impurity concentration is 1 ppm or lower, preferably 0.1 ppm or lower).

In addition, after the oxide semiconductor film is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace while the heating temperature is maintained or slow cooling is performed to lower the temperature from the heating temperature. It is preferable that water, hydrogen, and the like be not contained in the oxygen gas or the dinitrogen monoxide gas. The purity of the oxygen gas or the dinitrogen monoxide gas which is introduced into a heat treatment apparatus is preferably 6N or higher, more preferably 7N or higher (i.e., the impurity concentration in the oxygen gas or the dinitrogen monoxide gas is preferably 1 ppm or lower, more preferably 0.1 ppm or lower). The oxygen gas or the dinitrogen monoxide gas acts to supply oxygen in order that oxygen vacancies increased by the step of removing an impurity for the dehydration or dehydrogenation can be filled; thus, the oxide semiconductor film can have high purity and be an i-type (intrinsic) oxide semiconductor film.

Alternatively, as a method for supplying oxygen to the oxide semiconductor film, an ion implantation method, an ion doping method, a plasma immersion ion implantation method, a plasma treatment method, or the like may be used. In this case, oxygen supply to the oxide semiconductor film through the gate insulating film 130 to be formed later may be performed as well as oxygen supply directly to the oxide semiconductor film.

The introduction of oxygen to the oxide semiconductor film can be performed anytime after the dehydration or dehydrogenation treatment is performed thereon. Further, oxygen may be introduced plural times into the dehydrated or dehydrogenated oxide semiconductor film.

The oxide semiconductor film may be amorphous or may include a crystal component. In the case where an amorphous oxide semiconductor film is used, the amorphous oxide semiconductor film may be subjected to heat treatment in a later manufacturing step so as to be crystallized. The heat treatment for crystallizing the amorphous oxide semiconductor film is performed at a temperature higher than or equal to 250° C. and lower than or equal to 700° C., preferably higher than or equal to 400° C., further preferably higher than or equal to 500° C., still further preferably higher than or equal to 550° C. Note that the heat treatment can also serve as another heat treatment in the manufacturing process.

The oxide semiconductor film can be formed by a sputtering method, a molecular beam epitaxy (MBE) method, a CVD method, a pulse laser deposition method, an atomic layer deposition (ALD) method, or the like as appropriate. Alternatively, the oxide semiconductor film may be formed using a sputtering apparatus where film formation is performed with surfaces of a plurality of substrates set substantially perpendicular to a surface of a sputtering target.

In the formation of the oxide semiconductor film, the hydrogen concentration in the oxide semiconductor film is preferably reduced as much as possible. In order to reduce the hydrogen concentration, for example, in the case where the oxide semiconductor film is formed by a sputtering method, oxygen, a high-purity rare gas (typically, argon) from which impurities such as hydrogen, water, a hydroxyl group, and hydride have been removed, or a mixed gas of oxygen and the rare gas is used as appropriate as an atmosphere gas supplied to a deposition chamber of a sputtering apparatus.

The oxide semiconductor film is formed in such a manner that a sputtering gas from which hydrogen and moisture have been removed is introduced into the deposition chamber while moisture remaining therein is removed, whereby the hydrogen concentration in the formed oxide semiconductor film can be reduced. In order to remove moisture remaining in the deposition chamber, an entrapment vacuum pump such as a cryopump, an ion pump, or a titanium sublimation pump is preferably used. A turbo molecular pump provided with a cold trap may be alternatively used. A cryopump has a high capability in removing a hydrogen molecule, a compound containing a hydrogen atom such as water ($H_2O$) (preferably, also a compound containing a carbon atom), and the like; therefore, the impurity concentration in the oxide semiconductor film formed in the deposition chamber which is evacuated using a cryopump can be reduced.

Further, when the oxide semiconductor film is formed by a sputtering method, the relative density (filling rate) of a metal oxide target that is used for the deposition is greater than or equal to 90%, preferably greater than or equal to 95%. This is because, with the use of the oxide target with a high relative density, the formed oxide semiconductor film can be a dense film.

In order to reduce the impurity concentration in the oxide semiconductor film, it is also effective to form the oxide semiconductor film while the substrate is kept at high temperature. The temperature at which the substrate is heated may be higher than or equal to 150° C. and lower than or equal to 450° C.; the substrate temperature is preferably higher than or equal to 200° C. and lower than or equal to 350° C. By heating the substrate at high temperature during the film formation, a crystalline oxide semiconductor layer can be formed.

An oxide semiconductor used for the oxide semiconductor film preferably contains at least indium (In) or zinc (Zn). In particular, both In and Zn are preferably contained. As a stabilizer for reducing variation in electrical characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than In, Ga, and Zn.

Alternatively, a material represented by $InMO_3(ZnO)_m$ (m>0, m is not an integer) may be used as an oxide semiconductor. Note that M represents one or more metal elements selected from Ga, Fe, Mn, and Co. Alternatively, as the oxide semiconductor, a material represented by $In_2SnO_5(ZnO)_m$ (n>0, n is an integer) may be used.

Note that the oxide semiconductor film is preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

For example, an In—Ga—Zn-based oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having an appropriate composition may be used depending on needed semiconductor characteristics (such as mobility, threshold voltage, and variation). In order to obtain needed semiconductor characteristics, it is preferable that the carrier concentration, the impurity concentration, the defect density, the atomic ratio of a metal element to oxygen, the interatomic distance, the density, and the like be set to appropriate values.

For example, it is relatively easy to obtain high mobility with an In—Sn—Zn-based oxide. However, it is possible to obtain high mobility also with an In—Ga—Zn-based oxide by reducing the defect density in a bulk.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

It is preferable that a high-purity gas from which impurities such as hydrogen, water, a hydroxyl group, and a hydride are removed be used as a sputtering gas used for the formation of the oxide semiconductor film.

For the oxide semiconductor layer 120 in the initial stage, a film having a single crystal state, a polycrystalline (also referred to as polycrystal) state, an amorphous state, or the like can be used. The oxide semiconductor layer is preferably a c-axis aligned crystalline oxide semiconductor (CAAC-OS) film.

Sputtering may be performed to form an oxide semiconductor film of a CAAC-OS film. In order to obtain a CAAC-OS film by sputtering, it is important to form hexagonal crystals in an initial stage of deposition of an oxide semiconductor film and cause crystal growth from the hexagonal crystals as seeds. In order to achieve this, it is preferable that the distance between the target and the substrate be made longer (e.g., 150 mm to 200 mm) and the substrate heating temperature be 100° C. to 500° C., more preferably 200° C. to 400° C., still preferably 250° C. to 300° C. In addition to this, the deposited oxide semiconductor film is subjected to heat treatment at a temperature higher than the substrate heating temperature in the deposition, so that micro-defects in the film and defects at the interface of a stacked layer can be compensated.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the direction of c-axis of the crystal part is the direction parallel to a normal vector of the surface where the CAAC-OS film is formed just after the formation of the CAAC-OS film or a normal vector of the surface of the CAAC-OS film just after the formation of the CAAC-OS film. The crystal part is formed by the film formation or by performing treatment for crystallization such as heat treatment after the film formation.

With the use of the CAAC-OS film in a transistor, a change in electric characteristics of the transistor due to irradiation with visible light or ultraviolet light is small. Thus, the transistor has high reliability.

For the deposition of the CAAC-OS film, the following conditions are preferably used.

By reducing the amount of impurities entering the CAAC-OS film during the deposition, the crystal state can be prevented from being broken by the impurities. For example, impurities (e.g., hydrogen, water, carbon dioxide, or nitrogen) which exist in the deposition chamber may be reduced. Furthermore, impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

Note that the oxide semiconductor layer 120 may have a structure in which a plurality of oxide semiconductor layers is stacked. For example, the oxide semiconductor layer 120 may be a stack of a first oxide semiconductor layer and a second oxide semiconductor layer that are formed using metal oxides with different compositions.

Further, the constituent elements of the first oxide semiconductor layer and the second oxide semiconductor layer may be the same but the compositions of the constituent elements of the first oxide semiconductor layer and the second oxide semiconductor layer may be different from each other. For example, the first oxide semiconductor layer may have an atomic ratio of In:Ga:Zn=1:1:1, and the second oxide semiconductor layer may have an atomic ratio of In:Ga:Zn=3:1:2. Alternatively, the first oxide semiconductor layer may have an atomic ratio of In:Ga:Zn=1:3:2, and the second oxide semiconductor layer may have an atomic ratio of In:Ga:Zn=2:1:3.

In this case, one of the first oxide semiconductor layer and the second oxide semiconductor layer which is closer to the gate electrode (on a channel side) preferably contains In and Ga such that their contents satisfy In>Ga. The other which is farther from the gate electrode (on a back channel side) preferably contains In and Ga such that their contents satisfy In≤Ga (the Ga content is equal to or in excess of the In content).

In an oxide semiconductor, the s orbital of heavy metal mainly contributes to carrier transfer, and overlap of the s orbitals is likely to increase when the In content in the oxide semiconductor is increased. Therefore, an oxide having a composition of In>Ga has higher mobility than an oxide having a composition of In≤Ga. Further, the formation energy of oxygen vacancy is larger and thus oxygen vacancy is less likely to occur in Ga than in In; thus, the oxide having a composition of In≤Ga has more stable characteristics than the oxide having a composition of In>Ga.

An oxide semiconductor having a composition of In>Ga is used on the channel side and an oxide semiconductor having a composition of In≤Ga is used on the back channel side, whereby the mobility and reliability of the transistor can be further improved.

Further, oxide semiconductors having different crystallinities may be used for the first oxide semiconductor layer and the second oxide semiconductor layer. That is, the first oxide semiconductor layer and the second oxide semiconductor layer may be formed by using a combination of any of a single crystal oxide semiconductor film, a polycrystalline oxide semiconductor film, an amorphous oxide semiconductor film, and a CAAC-OS film as appropriate. When an amorphous oxide semiconductor film is used for at least one of the first oxide semiconductor layer and the second oxide semiconductor layer, internal stress or external stress of the oxide semiconductor layer 120 is relieved, variation in characteristics of a transistor is reduced, and the reliability of the transistor can be further improved.

On the other hand, an amorphous oxide semiconductor film is likely to absorb an impurity which serves as a donor, such as hydrogen, and is likely to generate oxygen vacancy, and thus easily becomes n-type. Thus, the oxide semiconductor layer on the channel side is preferably formed using a crystalline oxide semiconductor such as a CAAC-OS.

Further, the oxide semiconductor layer 120 may have a layered structure of three or more layers where an amorphous oxide semiconductor layer is sandwiched between a plurality of crystalline oxide semiconductor layers. Moreover, the oxide semiconductor layer 120 may have a structure in which a crystalline oxide semiconductor layer and an amorphous oxide semiconductor layer are alternately stacked.

The above structures used when the oxide semiconductor layer 120 has a layered structure of a plurality of layers can be employed in combination as appropriate.

Note that in the case where the oxide semiconductor layer 120 has a layered structure of a plurality of layers, oxygen may be introduced each time the oxide semiconductor layer is formed. Oxygen may be introduced by heat treatment in an oxygen atmosphere, an ion implantation method, an ion doping method, a plasma immersion ion implantation method, plasma treatment in an atmosphere containing oxygen, or the like.

Oxygen is introduced each time the oxide semiconductor layer is formed, whereby the effect of reducing oxygen vacancies in the oxide semiconductor can be improved.

In this embodiment, an example of using a CAAC-OS film as the oxide semiconductor layer 120 in the initial stage is described.

Then, the gate insulating film 130 is formed over the oxide semiconductor layer 120 by a plasma CVD method, a sputtering method, or the like. As the gate insulating film 130, a silicon oxide film, a gallium oxide film, an aluminum oxide film, a silicon nitride film, a silicon oxynitride film, an aluminum oxynitride film, or a silicon nitride oxide film can be used.

When the gate insulating film 130 is formed using a high-k material such as hafnium oxide, yttrium oxide, hafnium silicate ($HfSi_xO_y$ (x>0, y>0)), hafnium silicate to which nitrogen is added, hafnium aluminate ($HfAl_xO_y$ (x>0, y>0)), or lanthanum oxide, gate leakage current can be reduced. The structure of the gate insulating film 130 is not limited to a single-layer structure of any of the above materials, and may be a layered structure thereof.

Note that the gate insulating film 130 preferably contains oxygen and contains as little impurities such as water and hydrogen as possible because it is an insulating film in contact with the oxide semiconductor layer 120. In the case of using a plasma CVD method, hydrogen is contained in a source gas; thus, it is difficult to reduce the hydrogen concentration in the film as compared to the case of using a sputtering method. For that reason, in the case where the gate insulating film 130 is formed by a plasma CVD method, it is preferable to perform heat treatment for reducing or removing hydrogen (dehydration or dehydrogenation treatment) after the deposition.

The heat treatment is performed at a temperature higher than or equal to 250° C. and lower than or equal to 650° C., preferably higher than or equal to 450° C. and lower than or equal to 600° C. Note that in the case where a glass substrate is used, the heat treatment is performed at a temperature lower than the strain point of the glass substrate. For example, the substrate is introduced into an electric furnace, which is one kind of heat treatment apparatus, and heat treatment is performed on the gate insulating film 130 at 650° C. for one hour in a vacuum (reduced pressure) atmosphere.

Note that the heat treatment apparatus is not limited to an electric furnace, and a device for heating an object to be processed by heat conduction or heat radiation from a heating element such as a resistance heating element may be alternatively used. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the high-temperature gas, an inert gas which does not react with an object to be processed by heat treatment, such as nitrogen or a rare gas such as argon is used. Note that in the case where a GRTA apparatus is used as the heat treatment apparatus, the substrate may be heated in an inert gas heated to a high temperature of 650° C. to 700° C. because the heat treatment time is short.

The heat treatment may be performed in an atmosphere of nitrogen, oxygen, ultra-dry air (air in which the water content is 20 ppm or less, preferably 1 ppm or less, further preferably 10 ppb or less), or a rare gas (argon, helium, or the like). Note that it is preferable that water, hydrogen, or the like be not contained in the atmosphere of nitrogen, oxygen, ultra-dry air, or a rare gas. The purity of nitrogen, oxygen, or a rare gas which is introduced into a heat treatment apparatus is preferably 6N (99.9999%) or higher, more preferably 7N (99.99999%) or higher (that is, the impurity concentration is preferably 1 ppm or lower, more preferably 0.1 ppm or lower).

Through the heat treatment, the gate insulating film 130 can be dehydrated or dehydrogenated, whereby the gate insulating film 130 from which impurities such as hydrogen and water, which cause a change in characteristics of a transistor, are removed can be formed.

In heating treatment where dehydration or dehydrogenation treatment is performed, it is preferable that a surface of the gate insulating film 130 be not in a state where hydrogen, moisture, or the like is prevented from being released (for example, by providing a film or the like which is not permeable to hydrogen, moisture, or the like), but in a state where the surface of the gate insulating film 130 is exposed.

The heat treatment for dehydration or dehydrogenation may be performed more than once, and may also serve as another heat treatment.

Oxygen adding treatment may be performed on the dehydrated or dehydrogenated gate insulating film 130. Oxygen can be supplied to the gate insulating film 130 by an ion implantation method, an ion doping method, a plasma immersion ion implantation method, or a plasma treatment method, for example. Through this treatment, oxygen may be supplied also to the oxide semiconductor layer 120.

Figure 4B:
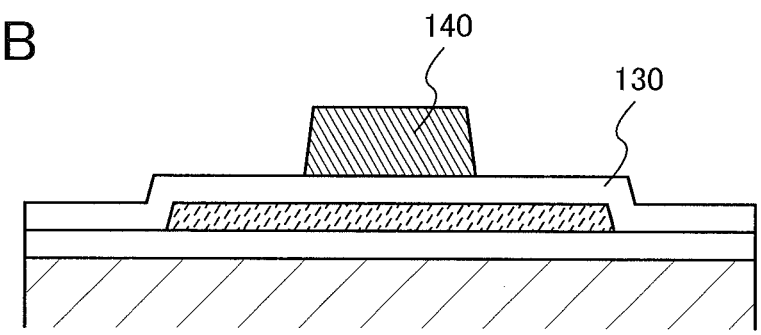

Next, a conductive film is formed over the gate insulating film 130 by a sputtering method or the like, and then processed into the gate electrode 140 by a photolithography method and an etching method (see FIG. 4B).

The conductive film to be the gate electrode 140 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode 140. The gate electrode 140 has either a single-layer structure or a layered structure.

The gate electrode 140 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. Alternatively, the gate electrode 140 may have a layered structure of the above conductive material and the above metal material.

As the gate electrode 140, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. Such a film has a work function of 5 eV (electron volts) or higher, preferably 5.5 eV or higher, and use of this film as the gate electrode enables the threshold voltage of a transistor to be a positive value. Accordingly, a so-called normally-off switching element can be obtained.

For example, the gate electrode 140 can be formed using a conductive layer having a three-layer structure in which tungsten nitride that prevents diffusion of copper is used for one of an upper layer and a lower layer, tantalum nitride is used for the other, and copper is used for a medium layer. In the case where such an electrode structure is employed, a photolithography process and an etching step need to be additionally performed to confine the copper; however, the electrode structure has a significantly high effect of preventing diffusion of copper, so that the reliability of the transistor can be improved.

End portions of the gate electrode 140 and an electrode or a wiring that can be formed through the same steps as the gate electrode 140 preferably have tapered shapes. When the end portion of the electrode or the wiring is tapered, coverage with an insulating film or the like formed thereover can be improved, which prevents a reduction in electrical characteristics and a reduction in reliability that are caused when the coverage is poor. Note that the taper angle of the end portion of the electrode or the wiring is preferably 40° to 80°.

Heat treatment may be performed after the gate electrode 140 is formed. For example, the heat treatment may be performed with a GRTA apparatus at 650° C. for 1 minute to 5 minutes. Alternatively, the heat treatment may be performed with an electric furnace at 500° C. for 30 minutes to 1 hour.

Figure 4C:
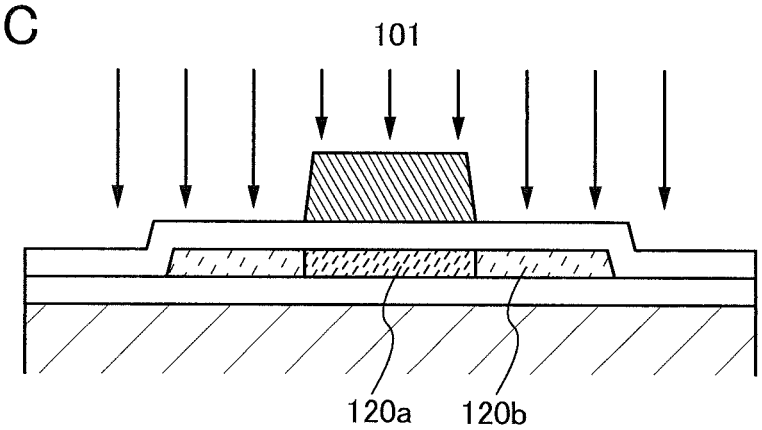
Figure 4D:
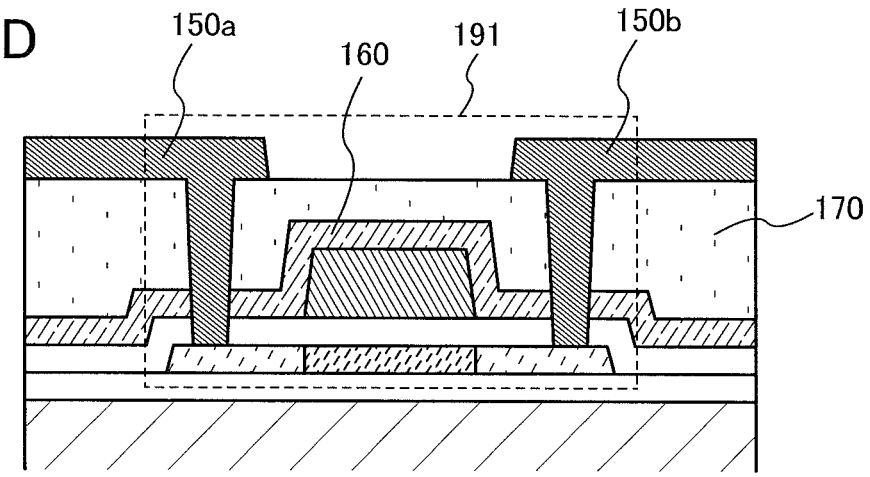

Next, oxygen 101 is added to the oxide semiconductor layer 120 with the gate electrode 140 used as a mask, whereby the channel formation region 120a and the source region or drain region 120b are formed (see FIG. 4C). For example, oxygen can be supplied to the oxide semiconductor layer 120 through the gate insulating film 130 by an ion implantation method, an ion doping method, a plasma immersion ion implantation method, a plasma treatment method, or the like. Through this treatment, oxygen may be supplied also to the gate insulating film 130.

In this embodiment, the oxygen 101 is implanted into a region to be the source region or drain region 120b by an ion implantation method. For example, in the case where the oxide semiconductor layer 120 has a thickness of 30 nm and the gate insulating film 130 has a thickness of 20 nm, $O^+$ with a dose of $1\times10^{15}/cm^2$ to $5\times10^{16}/cm^2$ may be implanted at an acceleration voltage of 5 kV to 30 kV. Alternatively, $O_2^+$ with a dose of $5\times10^{14}/cm^2$ to $2.5\times10^{16}/cm^2$ may be implanted at an acceleration voltage of 10 kV to 60 kV.

Here, the oxide semiconductor layer 120 in the initial stage is a CAAC-OS film, and the channel formation region maintains its state; however, the orderliness of atoms forming a crystal component in the region to be the source region or drain region 120b is disrupted by damage due to implanted oxygen atoms, and the region becomes amorphous.

Next, in the oxide semiconductor layer 120, an impurity is added to the region to be the source region or drain region 120b in order that the resistance of the region is lowered, whereby the source region or drain region 120b is formed. As a method for adding the impurity, an ion implantation method, an ion doping method, a plasma immersion ion implantation method, or the like can be used.

As the impurity for improving the conductivity of the oxide semiconductor layer 120, for example, one or more selected from the following can be used: phosphorus (P), arsenic (As), antimony (Sb), boron (B), aluminum (Al), nitrogen (N), argon (Ar), helium (He), neon (Ne), indium (In), fluorine (F), chlorine (Cl), titanium (Ti), zinc (Zn), and carbon (C).

The addition of the impurity may be controlled by setting the addition conditions such as the acceleration voltage and the dose, or the thickness of the film through which the dopant passes as appropriate. For example, in the case where phosphorus is used as the impurity added to the region to be the source region or drain region 120b, the impurity concentration in the region to which the impurity is added is preferably higher than or equal to $5\times10^{18}/cm^3$ and lower than or equal to $1\times10^{22}/cm^3$.

Note that $CO^+$ or $CO_2^+$ is implanted through the ion implantation step, whereby oxygen and carbon can be added to the source region or drain region 120b concurrently; thus, the number of times of the ion implantation step can be one. Since $CO_2^+$ has larger mass than $O_2^+$, the peak position of the implantation profile can be in a shallow region; thus, $CO_2^+$ is more suitable for implantation into a thin film.

Note that the addition of the impurity may be performed in the state where the substrate is heated. The addition of the impurity to the oxide semiconductor layer 120 may be performed a plurality of times, and a plurality of kinds of impurity may be used. The addition of the impurity may be performed before the step of adding oxygen to the region to be the source region or drain region 120b, after a step of forming the protective film 160, or after a step of performing heat treatment on the oxide semiconductor layer 120.

Then, the protective film 160 is preferably formed over the gate insulating film 130 and the gate electrode 140. As the protective film 160, an insulating film such as a silicon oxide film, a gallium oxide film, an aluminum oxide film, a silicon nitride film, a silicon oxynitride film, an aluminum oxynitride film, or a silicon nitride oxide film can be used.

As the protective film 160, an aluminum oxide film is particularly preferable. The aluminum oxide film has a high blocking effect of preventing penetration of both oxygen and an impurity such as hydrogen or moisture.

The aluminum oxide film can be directly formed by a sputtering method or the like. Alternatively, the aluminum oxide film can be formed in such a manner that an aluminum (Al) film is formed by a sputtering method or the like and then oxygen plasma treatment, oxygen ion implantation, oxygen ion doping, or the like is performed.

The protective film 160 may have a layered structure of an aluminum oxide film and any one or more of a silicon oxide film, a gallium oxide film, a silicon nitride film, a silicon oxynitride film, an aluminum oxynitride film, and a silicon nitride oxide film.

The protective film 160 may be subjected to oxygen adding treatment. For example, oxygen can be supplied to the protective film 160 by an ion implantation method, an ion doping method, a plasma immersion ion implantation method, a plasma treatment method, or the like.

Then, the oxide semiconductor layer 120 is subjected to heat treatment, whereby oxygen added to the source region or drain region 120b is made to be actively diffused in the lateral direction and oxygen vacancies formed in the channel formation region 120a through the above heat treatment for the dehydration or dehydrogenation of the gate insulating film 130 are filled. The heat treatment for the oxide semiconductor layer 120 can be performed similarly to the above heat treatment for the dehydration or dehydrogenation of the gate insulating film 130. Although this heat treatment may be performed anytime after the step of adding oxygen to the region to be the source region or drain region 120b, it is preferably performed after the formation of the protective film 160. The protective film 160 prevents release of oxygen through the protective film 160; thus, oxygen added to the source region or drain region 120b can be efficiently diffused to the channel formation region 120a.

Oxygen added to the source region or drain region 120b is partly diffused to the channel formation region 120a, and the amount of oxygen in the source region or drain region 120b is kept larger than that in the channel formation region 120a. Therefore, the source region or drain region 120b can serve as a source of oxygen for the channel formation region 120a continuously, and oxygen vacancies in the channel formation region 120a which are caused owing to long-time operation or operation environment of the transistor can be filled. Note that excessive oxygen in the source region or drain region 120b can be diffused to the channel formation region 120a even at room temperature.

Then, the planarization film 170 is formed over the protective film 160 as needed. For the planarization film, an organic material having heat resistance such as a polyimide-based resin, an acrylic-based resin, a polyimide amide-based resin, a benzocyclobutene-based resin, a polyamide-based resin, or an epoxy-based resin can be used as well as the insulating film that can be used as the protective film 160. In addition to such organic materials, it is also possible to use a low-dielectric constant material (low-k material), a siloxane-based resin, phosphosilicate glass (PSG), borophosphosilicate glass (BPSG), or the like. Note that the planarization film may be formed by stacking a plurality of insulating films formed using any of these materials. Alternatively, a surface of the formed film may be planarized by a CMP method or the like.

For example, a 1500-nm-thick acrylic resin film may be formed as the planarization film 170. The acrylic resin film can be formed in such a manner that an acrylic resin is applied by a coating method and then baked (e.g., at 250° C. for one hour in a nitrogen atmosphere).

Next, contact holes are formed in the planarization film 170, the protective film 160, and the gate insulating film 130 by a photolithography method and an etching method. Then, a conductive film is formed over the planarization film 170 by a sputtering method or the like so as to fill the contact holes, and is then processed into the source electrode 150a and the drain electrode 150b by a photolithography method and an etching method (see FIG. 4D).

The conductive film can be formed using an element selected from aluminum, chromium, copper, tantalum, titanium, molybdenum, tungsten, and the like; an alloy containing any of these elements as a component; an alloy containing any of these elements in combination; or the like. Further, the conductive film may have a single-layer structure or a layered structure of two or more layers. For example, a structure may be employed in which a film of a refractory metal such as chromium, tantalum, titanium, molybdenum, or tungsten or a conductive nitride film thereof is stacked over and/or below a metal film of aluminum, copper, or the like. Further, one or more materials selected from manganese, magnesium, zirconium, beryllium, neodymium, and scandium may be used.

Through the above steps, the transistor 191 illustrated in FIGS. 1A and 1B can be manufactured.

A method for manufacturing the transistor 192 illustrated in FIGS. 2A and 2B is as follows.

Figure 5A:
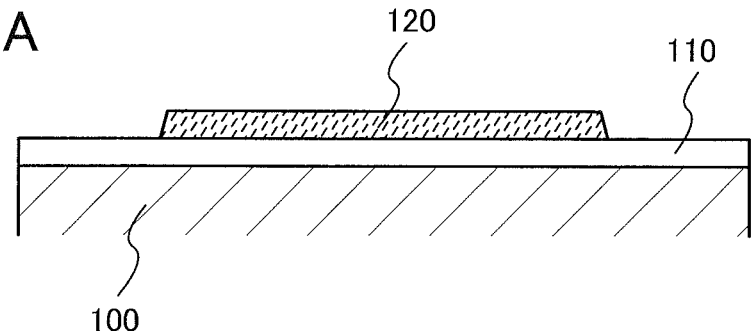
FIGS. 5A to 5D illustrate a method for manufacturing a semiconductor device according to one embodiment of the present invention.

First, the oxide semiconductor layer 120 is formed over the base insulating film 110 over the substrate 100 (see FIG. 5A).

Figure 5B:
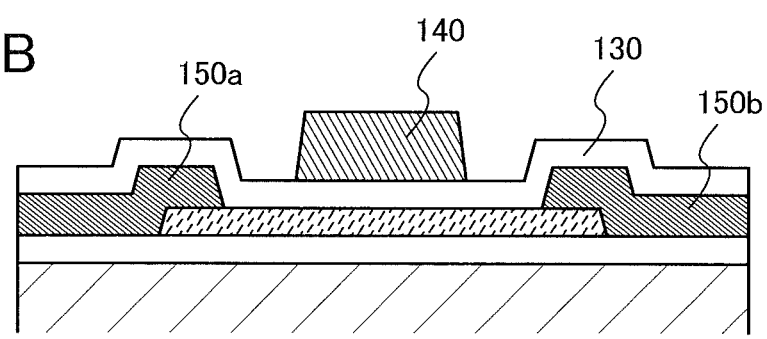

Next, the source electrode 150a and the drain electrode 150b are formed in contact with part of the oxide semiconductor layer, and then the gate insulating film 130 is formed over the oxide semiconductor layer, and the source electrode and the drain electrode (see FIG. 5B).

Figure 5C:
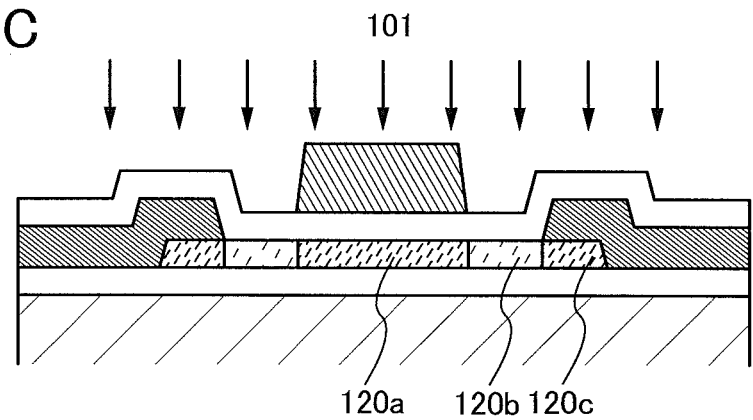

Then, oxygen and an impurity for improving conductivity are added to the oxide semiconductor layer 120 by an ion implantation method or the like with the gate electrode 140, the source electrode 150*a*, and the drain electrode 150*b* as masks, whereby the channel formation region 120*a*, the source region or drain region 120*b*, and the region 120*c* are formed (see FIG. 5C).

Next, heat treatment is performed after the protective film 160 is formed, whereby oxygen is diffused from the source region or drain region 120*b* to the channel formation region 120*a*.

Figure 5D:
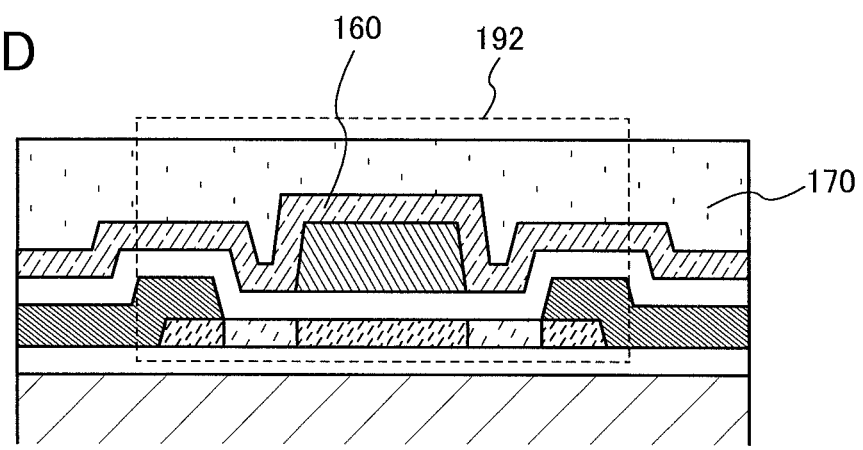

Then, the planarization film 170 is formed as needed (see FIG. 5D).

Through the above steps, the transistor 192 illustrated in FIGS. 2A and 2B can be manufactured. Note that the transistor 192 can be formed using materials similar to those of the transistor 191, and the method for manufacturing the transistor 191 can be referred to for the details thereof.

A method for manufacturing the transistor 193 illustrated in FIGS. 3A and 3B is as follows.

First, the source electrode 150*a* and the drain electrode 150*b* are formed over the base insulating film 110 over the substrate 100.

Figure 6A:
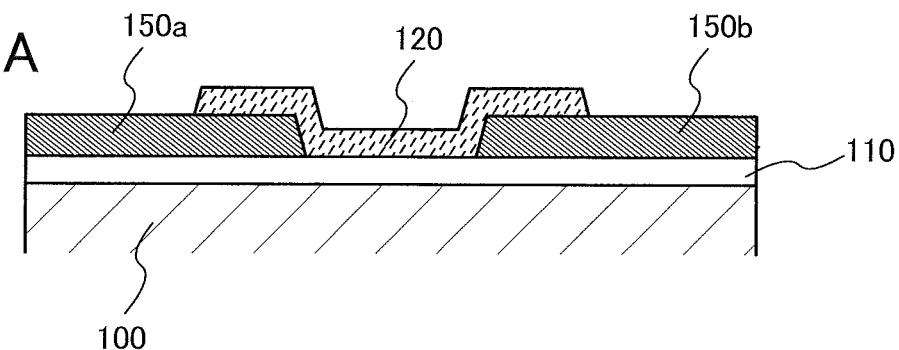
FIGS. 6A to 6D illustrate a method for manufacturing a semiconductor device according to one embodiment of the present invention.

Then, the oxide semiconductor layer 120 is formed in contact with part of the source electrode 150*a* and the drain electrode 150*b* (see FIG. 6A).

Figure 6B:
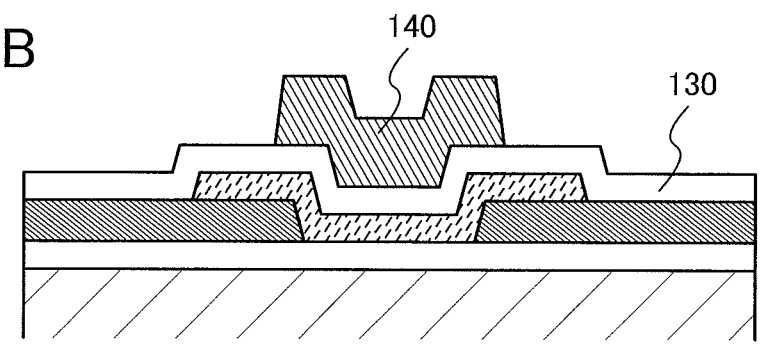

Next, the gate insulating film 130 is formed over the source electrode 150*a*, the drain electrode 150*b*, and the oxide semiconductor layer 120, and then the gate electrode 140 is formed over the gate insulating film (see FIG. 6B).

Figure 6C:
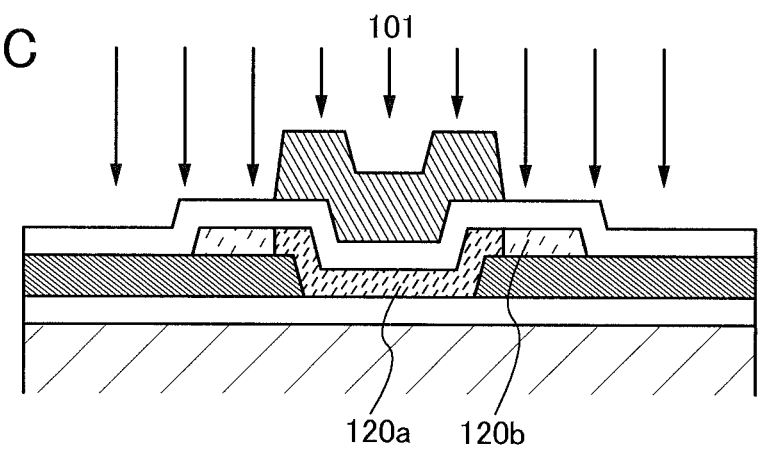

Next, oxygen is added to the oxide semiconductor layer 120 by an ion implantation method or the like with the gate electrode 140 used as a mask, whereby the channel formation region 120*a* and the source region or drain region 120*b* are formed (see FIG. 6C). Note that an impurity for improving conductivity may be added to the source region or drain region 120*b*.

Next, heat treatment is performed after the protective film 160 is formed, whereby oxygen is diffused from the source region or drain region 120*b* to the channel formation region 120*a*.

Figure 6D:
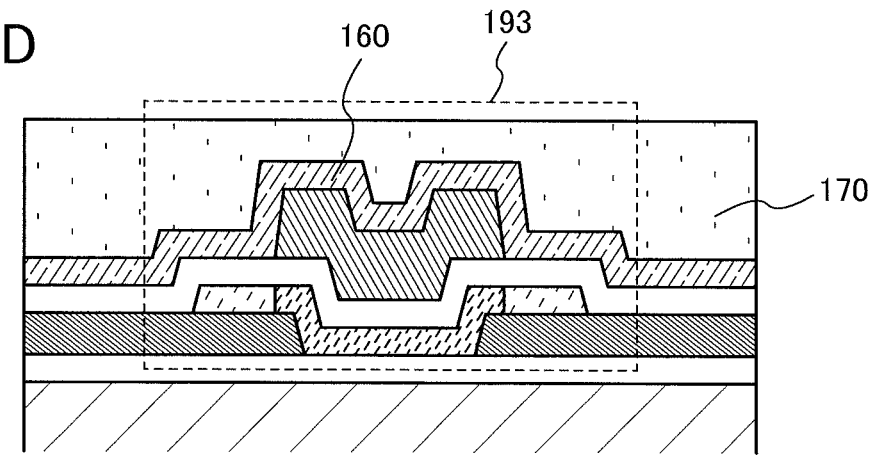

Then, the planarization film 170 is formed as needed (see FIG. 6D).

Through the above steps, the transistor 193 illustrated in FIGS. 3A and 3B can be manufactured. Note that the transistor 193 can be formed using materials similar to those of the transistor 191, and the method for manufacturing the transistor 191 can be referred to for the details thereof.

This embodiment can be implemented in appropriate combination with any of the structures described in the other embodiments.

Embodiment 2

In this embodiment, an example of a semiconductor device (memory device) which includes a transistor according to one embodiment of the present invention, which can hold stored data even when not powered, and which has an unlimited number of write cycles will be described with reference to drawings.

Figure 7A:
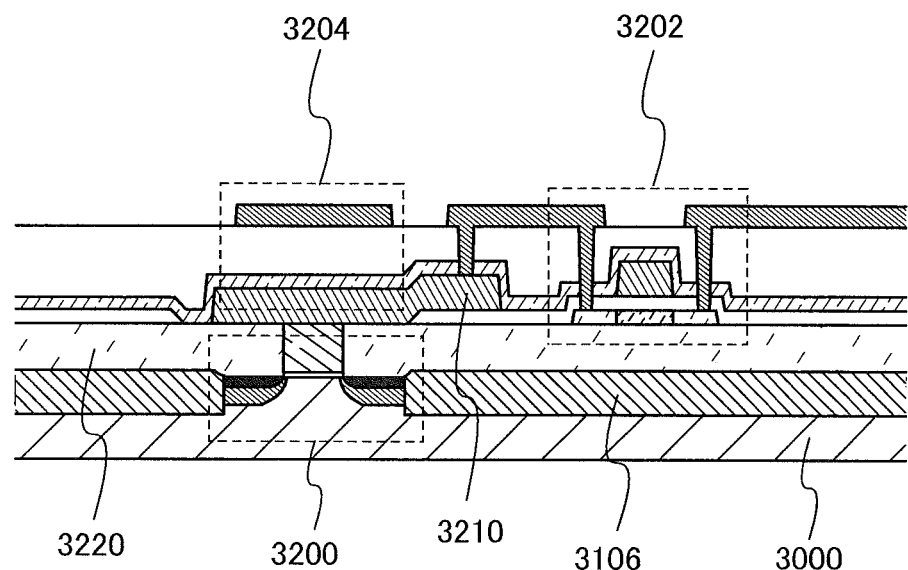
FIGS. 7A and 7B are a cross-sectional view and a circuit diagram illustrating one embodiment of a semiconductor device.
Figure 7B:
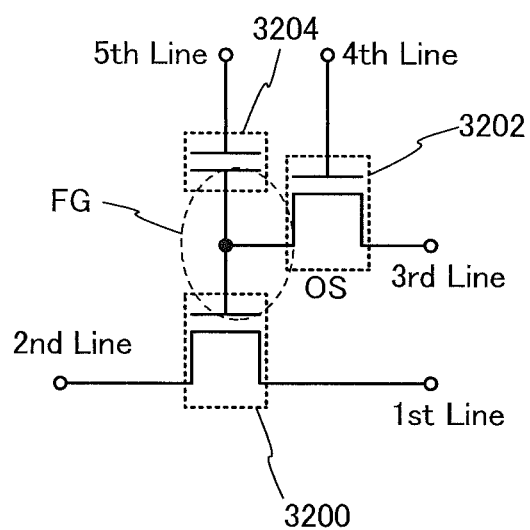

FIGS. 7A and 7B illustrate an example of a configuration of the semiconductor device. FIG. 7A is a cross-sectional view of the semiconductor device, and FIG. 7B is a circuit diagram of the semiconductor device.

The semiconductor device illustrated in FIGS. 7A and 7B includes a transistor 3200 including a first semiconductor material in a lower portion, and a transistor 3202 including a second semiconductor material and a capacitor 3204 in an upper portion. An example of applying the transistor illustrated in FIGS. 1A and 1B in Embodiment 1 to the transistor 3202 is described. One electrode of the capacitor 3204 is formed using the same material as a gate electrode of the transistor 3202, the other electrode thereof is formed using the same material as a source electrode and a drain electrode of the transistor 3202, and a dielectric thereof is formed using the same material as a protective film and a planarization film of the transistor 3202; thus, the capacitor 3204 can be formed concurrently with the transistor 3202.

Here, the first semiconductor material and the second semiconductor material are preferably materials having different band gaps. For example, the first semiconductor material may be a semiconductor material (such as silicon) other than an oxide semiconductor, and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

Although both of the above transistors are n-channel transistors in the following description, it is needless to say that p-channel transistors can be used. The specific structure of the semiconductor device, such as the material used for the semiconductor device and the structure of the semiconductor device, is not necessarily limited to those described here except for the use of the transistor described in Embodiment 1, which is formed using an oxide semiconductor for holding data.

The transistor 3200 in FIG. 7A includes a channel formation region provided in a substrate 3000 including a semiconductor material (such as crystalline silicon), impurity regions provided such that the channel formation region is sandwiched therebetween, intermetallic compound regions provided in contact with the impurity regions, a gate insulating film provided over the channel formation region, and a gate electrode provided over the gate insulating film. Note that a transistor whose source electrode and drain electrode are not illustrated in a drawing may also be referred to as a transistor for the sake of convenience. Further, in such a case, in description of a connection of a transistor, a source region and a source electrode may be collectively referred to as a source electrode, and a drain region and a drain electrode may be collectively referred to as a drain electrode. That is, in this specification, the term "source electrode" may include a source region.

Further, an element isolation insulating layer 3106 is formed on the substrate 3000 so as to surround the transistor 3200, and an insulating layer 3220 is formed so as to cover the transistor 3200. Note that the element isolation insulating layer 3106 can be formed by an element isolation technique such as local oxidation of silicon (LOCOS) or shallow trench isolation (STI).

For example, the transistor 3200 formed using a crystalline silicon substrate can operate at high speed. Thus, when the transistor is used as a reading transistor, data can be read at high speed. As treatment prior to formation of the transistor 3202 and the capacitor 3204, CMP treatment is performed on the insulating layer 3220 covering the transistor 3200, whereby the insulating layer 3220 is planarized and, at the same time, an upper surface of the gate electrode of the transistor 3200 is exposed.

A connection wiring 3210 is provided over the gate electrode of the transistor 3200 to be electrically connected to the gate electrode. The transistor 3202 is provided over the insulating layer 3220, and one of the source electrode and the drain electrode of the transistor 3202 is electrically connected to the connection wiring 3210. Note that the connection wiring 3210 also serves as the one electrode of the capacitor 3204.

The transistor 3202 in FIG. 7A is a bottom-gate transistor in which a channel is formed in an oxide semiconductor layer. Since the off-state current of the transistor 3202 is small, stored data can be held for a long time owing to such a transistor. In other words, refresh operation becomes unnecessary or the frequency of the refresh operation in a semiconductor memory device can be extremely lowered, which leads to a sufficient reduction in power consumption.

The transistor 3200 and the capacitor 3204 can be formed so as to overlap with each other as illustrated in FIG. 7A, whereby the area occupied by them can be reduced. Accordingly, the degree of integration of the semiconductor device can be increased.

An example of a circuit configuration corresponding to FIG. 7A is illustrated in FIG. 7B.

In FIG. 7B, a first wiring (1st Line) is electrically connected to a source electrode of the transistor 3200. A second wiring (2nd Line) is electrically connected to a drain electrode of the transistor 3200. A third wiring (3rd Line) is electrically connected to one of the source and drain electrodes of the transistor 3202, and a fourth wiring (4th Line) is electrically connected to the gate electrode of the transistor 3202. The gate electrode of the transistor 3200 and the other of the source and drain electrodes of the transistor 3202 are electrically connected to the one electrode of the capacitor 3204. A fifth wiring (5th Line) is electrically connected to the other electrode of the capacitor 3204.

The semiconductor device in FIG. 7B utilizes a characteristic in which the potential of the gate electrode of the transistor 3200 can be held, and thus enables data writing, holding, and reading as follows.

Writing and holding of data will be described. First, the potential of the fourth wiring is set to a potential at which the transistor 3202 is turned on, so that the transistor 3202 is turned on. Accordingly, the potential of the third wiring is supplied to the gate electrode of the transistor 3200 and to the capacitor 3204. That is, predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring is set to a potential at which the transistor 3202 is turned off, so that the transistor 3202 is turned off. Thus, the charge supplied to the gate electrode of the transistor 3200 is held (holding).

Since the off-state current of the transistor 3202 is significantly small, the charge of the gate electrode of the transistor 3200 is held for a long time.

Next, reading of data will be described. By supplying an appropriate potential (a reading potential) to the fifth wiring while supplying a predetermined potential (a constant potential) to the first wiring, the potential of the second wiring varies depending on the amount of charge held at the gate electrode of the transistor 3200. This is because in general, when the transistor 3200 is an n-channel transistor, an apparent threshold voltage $V_{th\_H}$ in the case where the high-level charge is given to the gate electrode of the transistor 3200 is lower than an apparent threshold voltage $V_{th\_L}$ in the case where the low-level charge is given to the gate electrode of the transistor 3200. Here, an apparent threshold voltage refers to the potential of the fifth wiring which is needed to turn on the transistor 3200. Thus, the potential of the fifth wiring is set to a potential $V_0$ which is between $V_{th\_H}$ and $V_{th\_L}$, whereby charge supplied to the gate electrode of the transistor 3200 can be determined. For example, in the case where the high-level charge is supplied in writing, when the potential of the fifth wiring is $V_0$ ($>V_{th\_H}$), the transistor 3200 is turned on. In the case where the low-level charge is supplied in writing, even when the potential of the fifth wiring is $V_0$ ($<V_{th\_L}$), the transistor 3200 remains off. Therefore, the data held can be read by determining the potential of the second wiring.

Note that in the case where memory cells are arrayed, it is necessary that data of only a desired memory cell can be read. The fifth wirings of memory cells from which data is not read may be supplied with a potential at which the transistor 3200 is turned off regardless of the state of the gate electrode, that is, a potential lower than $V_{th\_H}$. Alternatively, the fifth wirings may be supplied with a potential at which the transistor 3200 is turned on regardless of the state of the gate electrode, that is, a potential higher than $V_{th\_L}$.

When including a transistor having a channel formation region formed using an oxide semiconductor and having extremely small off-state current, the semiconductor device described in this embodiment can store data for an extremely long period. In other words, refresh operation becomes unnecessary or the frequency of the refresh operation can be extremely lowered, which leads to a sufficient reduction in power consumption. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. That is, the semiconductor device according to the disclosed invention does not have a limitation on the number of times data can be rewritten, which is a problem of a conventional nonvolatile memory, and the reliability thereof is drastically improved. Furthermore, data is written depending on the on state and the off state of the transistor, whereby high-speed operation can be easily achieved.

As described above, a miniaturized and highly integrated semiconductor device having favorable electrical characteristics and a method for manufacturing the semiconductor device can be provided.

This embodiment can be implemented in appropriate combination with any of the structures described in the other embodiments.

Embodiment 3

In this embodiment, a semiconductor device including the transistor described in Embodiment 1, which can hold stored data even when not powered, which does not have a limitation on the number of write cycles, and which has a structure different from the structure described in Embodiment 2 will be described.

Figure 8A:
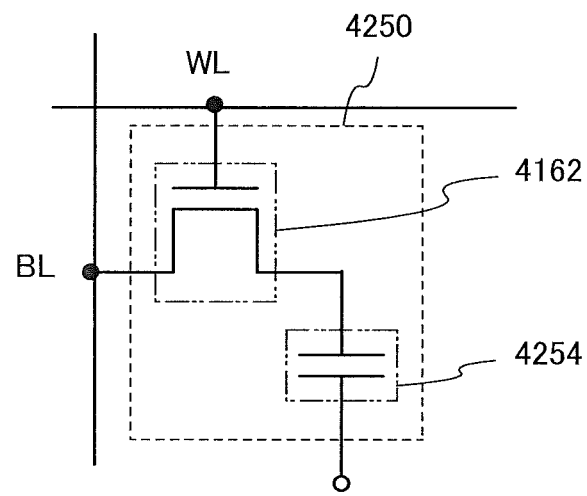
FIGS. 8A and 8B are a circuit diagram and a perspective view illustrating one embodiment of a semiconductor device.
Figure 8B:
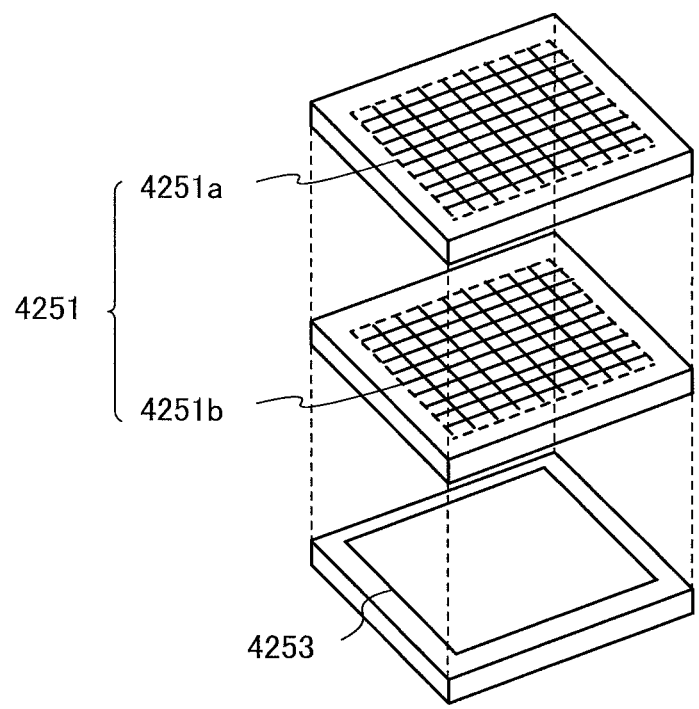

FIG. 8A illustrates an example of a circuit configuration of a semiconductor device, and FIG. 8B is a conceptual diagram illustrating an example of a semiconductor device. As a transistor 4162 included in the semiconductor device, the transistor described in Embodiment 1 can be used. A capacitor 4254 can be formed similarly to the capacitor 3204 described in Embodiment 2 through the same process as and concurrently with the transistor 4162.

In the semiconductor device illustrated in FIG. 8A, a bit line BL is electrically connected to a source electrode of the transistor 4162, a word line WL is electrically connected to a gate electrode of the transistor 4162, and a drain electrode of the transistor 4162 is electrically connected to a first terminal of the capacitor 4254.

Next, writing and holding of data in the semiconductor device (a memory cell 4250) illustrated in FIG. 8A will be described.

First, the potential of the word line WL is set to a potential at which the transistor 4162 is turned on, and the transistor 4162 is turned on. Accordingly, the potential of the bit line BL is supplied to the first terminal of the capacitor 4254 (writing). After that, the potential of the word line WL is set to a potential at which the transistor 4162 is turned off, so that the transistor 4162 is turned off. Thus, the potential at the first terminal of the capacitor 4254 is held (holding).

In addition, the amount of off-state current is extremely small in the transistor 4162 which uses an oxide semiconductor. For that reason, the potential of the first terminal of the capacitor 4254 (or a charge accumulated in the capacitor 4254) can be held for an extremely long period by turning off the transistor 4162.

Next, reading of data will be described. When the transistor 4162 is turned on, the bit line BL which is in a floating state and the capacitor 4254 are electrically connected to each other, and the charge is redistributed between the bit line BL and the capacitor 4254. As a result, the potential of the bit line BL is changed. The amount of change in potential of the bit line BL varies depending on the potential of the first terminal of the capacitor 4254 (or the charge accumulated in the capacitor 4254).

For example, the potential of the bit line BL after charge redistribution is $(C_B \times V_{B0} + C \times V)/(C_B + C)$, where V is the potential of the first terminal of the capacitor 4254, C is the capacitance of the capacitor 4254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 4250 is in either of two states in which the potentials of the first terminal of the capacitor 4254 are $V_1$ and $V_0$ ($V_1 > V_0$), the potential of the bit line BL in the case of holding the potential $V_1$ (=$(C_B \times V_{B0} + C \times V_1)/(C_B + C)$) is higher than the potential of the bit line BL in the case of holding the potential $V_0$ (=$(C_B \times V_{B0} + C \times V_0)/(C_B + C)$).

Then, by comparing the potential of the bit line BL with a predetermined potential, data can be read.

As described above, the semiconductor device illustrated in FIG. 8A can hold charge that is accumulated in the capacitor 4254 for a long time because the off-state current of the transistor 4162 is extremely small. In other words, refresh operation becomes unnecessary or the frequency of the refresh operation can be extremely lowered, which leads to a sufficient reduction in power consumption. Moreover, stored data can be held for a long period even when power is not supplied.

Next, the semiconductor device illustrated in FIG. 8B will be described.

The semiconductor device illustrated in FIG. 8B includes a memory cell array 4251 (memory cell arrays 4251*a* and 4251*b*) including a plurality of memory cells 4250 illustrated in FIG. 8A as memory circuits in the upper portion, and a peripheral circuit 4253 in the lower portion, which is necessary for operating the memory cell array 4251. Note that the peripheral circuit 4253 is electrically connected to the memory cell array 4251.

In the structure illustrated in FIG. 8B, the peripheral circuit 4253 can be provided under the memory cell array 4251. Thus, the size of the semiconductor device can be decreased.

It is preferable that a semiconductor material of the transistor provided in the peripheral circuit 4253 be different from that of the transistor 4162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Thus, the transistor enables a variety of circuits (e.g., a logic circuit and a driver circuit) which need to operate at high speed to be favorably obtained.

Note that FIG. 8B illustrates, as an example, the semiconductor device in which the memory cell array 4251 has a stack of the memory cell array 4251*a* and the memory cell array 4251*b*; however, the number of stacked memory cell arrays is not limited to two. For the memory cell array 4251, a stack of three or more memory cell arrays may be used, or only one memory cell array may be used.

The transistor 4162 is formed using an oxide semiconductor. Since the off-state current of the transistor including an oxide semiconductor is small, stored data can be held for a long time. In other words, the frequency of refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

As described above, a miniaturized and highly integrated semiconductor device having favorable electrical characteristics can be provided.

This embodiment can be implemented in appropriate combination with any of the structures described in the other embodiments.

Embodiment 4

In this embodiment, a central processing unit (CPU) at least part of which includes any of the transistors disclosed in the above embodiments will be described.

Figure 9A:
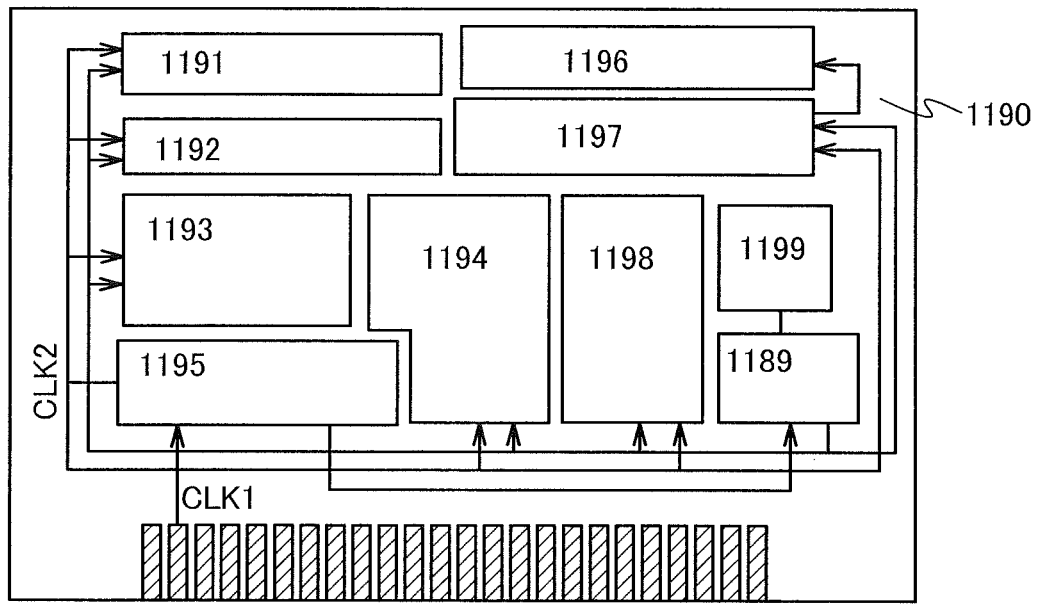
FIG. 9A is a block diagram illustrating a structure example of a CPU, and FIGS. 9B and 9C each illustrate a configuration example of part of the CPU.

FIG. 9A is a block diagram illustrating a specific structure of the CPU. The CPU illustrated in FIG. 9A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM I/F 1189 may be provided over a separate chip. Obviously, the CPU illustrated in FIG. 9A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 9A, a memory cell is provided in the register 1196. As the memory cell in the register 1196, the memory cell described in the above embodiment can be used.

In the CPU illustrated in FIG. 9A, the register controller 1197 selects operation of retaining data in the register 1196 in accordance with an instruction from the ALU 1191. That is, the register controller 1197 selects whether data is retained by a logic inversion element or a capacitor in the memory cell included in the register 1196. When data retention by the logic inversion element is selected, a power supply voltage is supplied to the memory cell in the register 1196. When data retention by the capacitor is selected, the data in the capacitor is rewritten, and supply of the power supply voltage to the memory cell in the register 1196 can be stopped.

Figure 9B:
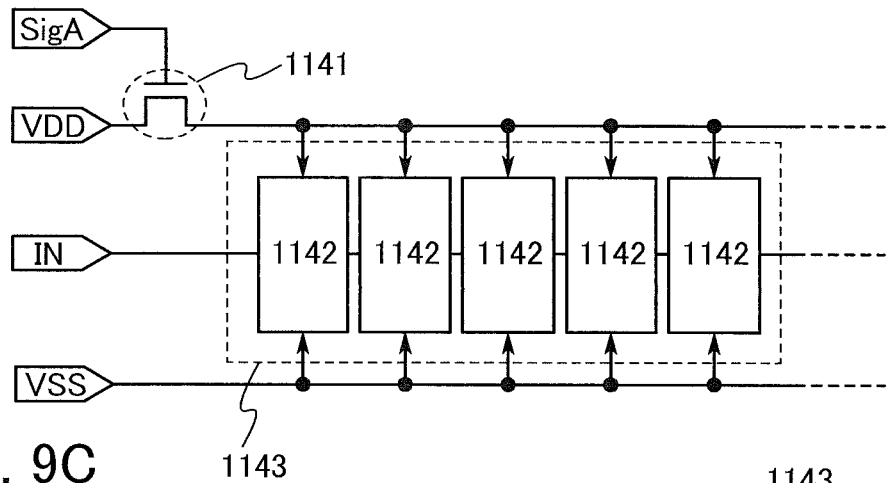
Figure 9C:
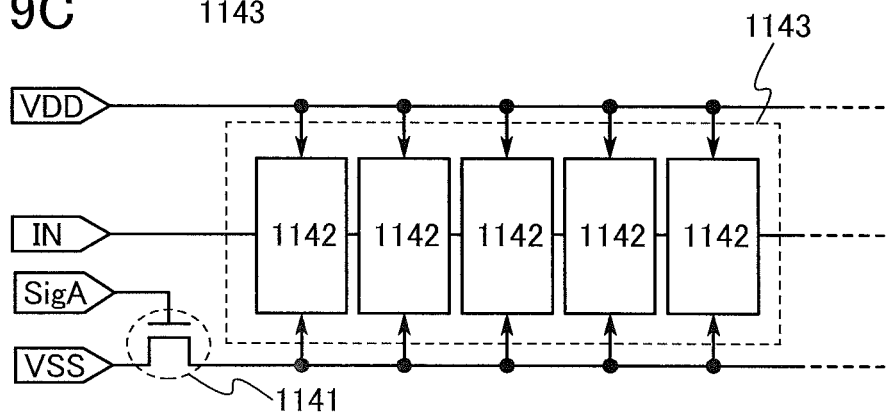

A switching element provided between a memory cell group and a node to which a power supply potential VDD or a power supply potential VSS is supplied, as illustrated in FIG. 9B or FIG. 9C, allows the power supply to be stopped. Circuits illustrated in FIGS. 9B and 9C will be described below.

FIGS. 9B and 9C each illustrate an example of a structure of a memory circuit including any of the transistors described in the above embodiments as a switching element for controlling supply of a power supply potential to a memory cell.

The memory device illustrated in FIG. 9B includes a switching element 1141 and a memory cell group 1143 including a plurality of memory cells 1142. Specifically, as each of the memory cells 1142, the memory cell described in the above embodiment can be used. Each of the memory cells 1142 included in the memory cell group 1143 is supplied with the high-level power supply potential VDD through the switching element 1141. Further, each of the memory cells 1142 included in the memory cell group 1143 is supplied with a potential of a signal IN and a potential of the low-level power supply potential VSS.

In FIG. 9B, any of the transistors disclosed in any of the above embodiments is used as the switching element 1141, and the switching of the transistor is controlled by a signal SigA supplied to a gate electrode thereof.

Note that FIG. 9B illustrates the structure in which the switching element 1141 includes only one transistor; however, without limitation, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 9B, the switching element 1141 may control the supply of the low-level power supply potential VSS.

In FIG. 9C, an example of a memory device in which each of the memory cells 1142 included in the memory cell group 1143 is supplied with the low-level power supply potential VSS through the switching element 1141 is illustrated. The supply of the low-level power supply potential VSS to each of the memory cells 1142 included in the memory cell group 1143 can be controlled by the switching element 1141.

In the memory cell described in the above embodiment, data can be held even in the case where supply of the power supply voltage is stopped. Therefore, even when the supply of the power supply voltage to the entire CPU including the memory cell group 1143 is stopped as appropriate, the operation speed of the CPU does not become low. Specifically, in the memory cell group 1143, desired data is held even during a period in which the supply of the power supply voltage is stopped. Further, at the time of resuming the supply of the power supply voltage, the CPU can operate using the held data at once. By stopping the supply of the power supply voltage to the CPU in this manner as appropriate, a reduction in power consumption can be achieved.

Although the CPU is given as an example, the transistor can also be applied to an LSI such as a digital signal processor (DSP), a custom LSI, or a field programmable gate array (FPGA).

This embodiment can be implemented in appropriate combination with any of the structures described in the other embodiments.

Embodiment 5

A semiconductor device disclosed in this specification can be applied to a variety of electronic devices (including an amusement machine). Examples of electronic devices include the following: display devices such as televisions and monitors, lighting devices, desktop or laptop personal computers, word processors, devices which write data of still images or moving images to recording media such as optical discs or reproduce them, audio players, radios, stereos, phones, transceivers, portable wireless devices, cellular phones, game machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, air-conditioning systems such as air conditioners, dish washing machines, dish drying machines, clothes dryers, futon dryers, electric refrigerators, electric freezers, electric refrigerator-freezers, freezers for preserving DNA, smoke detectors, radiation counters, medical equipment such as dialyzers. Further examples include industrial equipment such as guide lights, traffic lights, belt conveyors, elevators, escalators, industrial robots, and power storage systems. Note that moving objects driven by an internal-combustion engine or a motor using electric power are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Some specific examples of such electronic devices are illustrated in FIGS. 10A to 10C, FIGS. 11A to 11C, and FIGS. 12A to 12C.

Figure 10A:
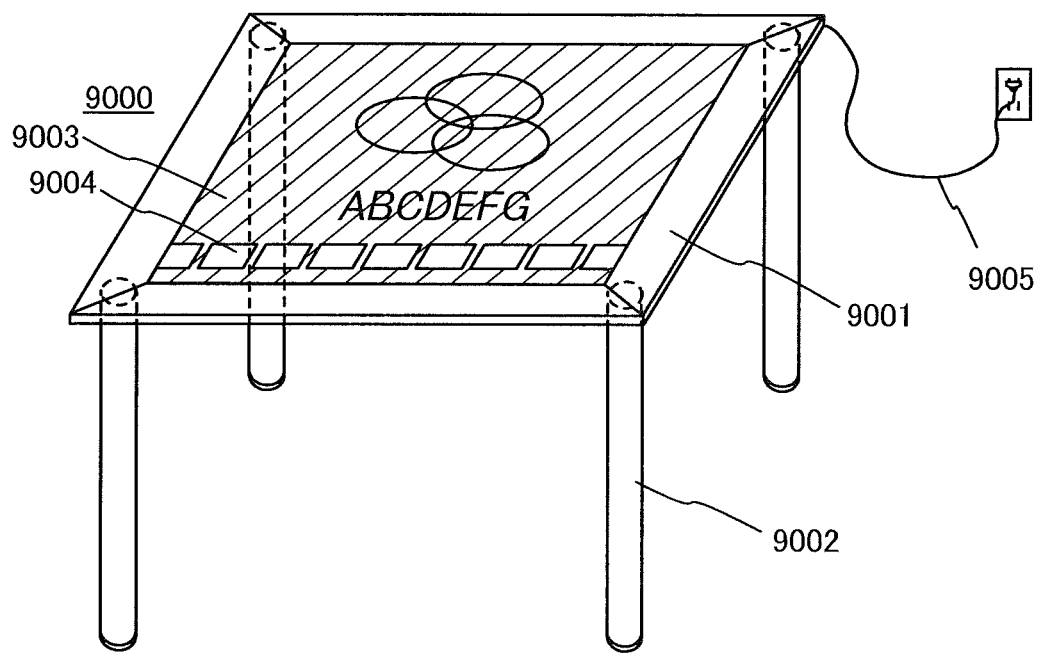
FIGS. 10A to 10C each illustrate an electronic device.

FIG. 10A illustrates a table having a display portion. In a table 9000, a display portion 9003 is incorporated in a housing 9001 and an image can be displayed on the display portion 9003. Note that the housing 9001 is supported by four leg portions 9002. Further, the housing 9001 is provided with a power cord 9005 for supplying power.

The transistor described in Embodiment 1 can be used in the display portion 9003 so that the electronic device can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table is capable of communicating with other home appliances or control the home appliances, the table 9000 may function as a control device which controls the home appliances by operation on the screen. For example, with the use of a semiconductor device having an image sensing function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be effectively used.

Figure 10B:
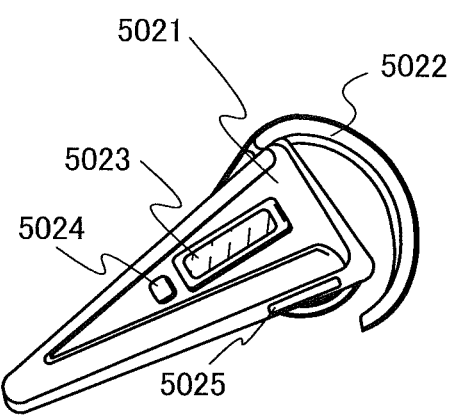

FIG. 10B illustrates an audio player, which includes, in a main body 5021, a display portion 5023, a fixing portion 5022 with which the main body is worn on the ear, a speaker, an operation button 5024, an external memory slot 5025, and the like. When the transistor described in Embodiment 1 or the memory described in Embodiment 2 is used in a memory or a CPU incorporated in the main body 5021, power consumption of the audio player can be further reduced.

Furthermore, when the audio player illustrated in FIG. 10B has an antenna, a microphone function, or a wireless communication function and is used with a mobile phone, a user can talk on the phone wirelessly in a hands-free way while driving a car or the like.

Figure 10C:
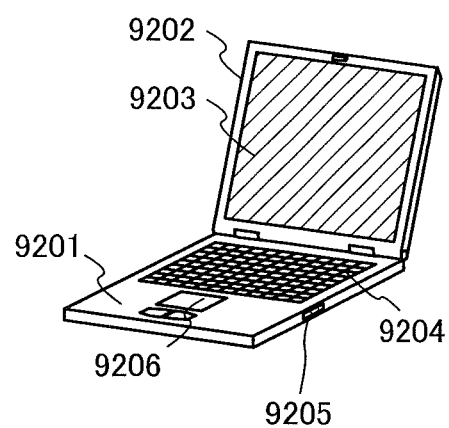

FIG. 10C illustrates a computer, which includes a main body 9201 including a CPU, a housing 9202, a display portion 9203, a keyboard 9204, an external connection port 9205, a pointing device 9206, and the like. The transistor described in Embodiment 1 can be used for the display portion 9203 in the computer. When the CPU described in Embodiment 4 is used, power consumption of the computer can be reduced.

Figure 11A:
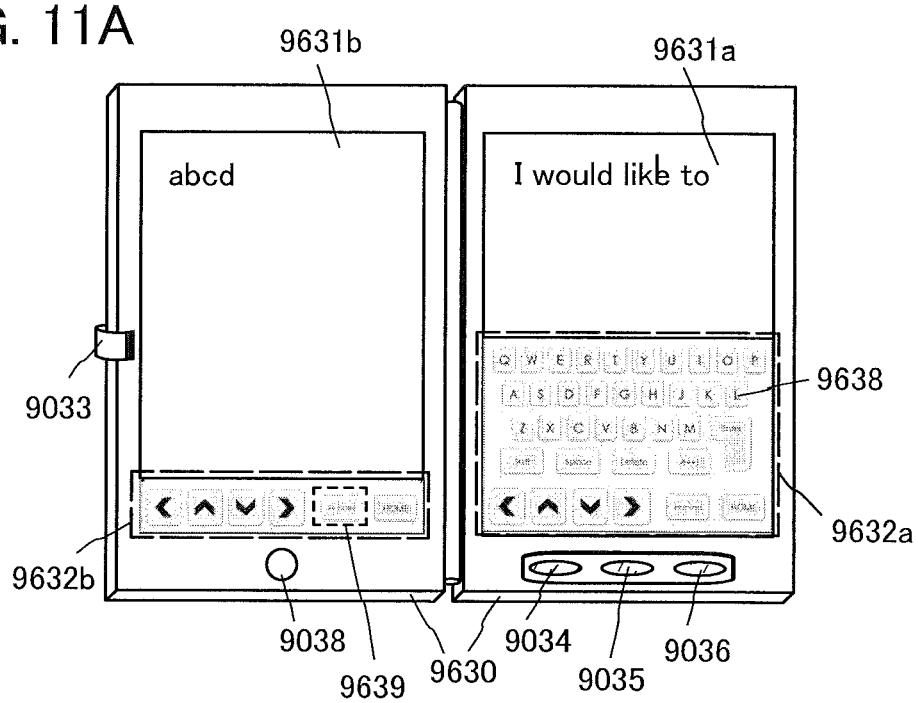
FIGS. 11A to 11C illustrate an electronic device.
Figure 11B:
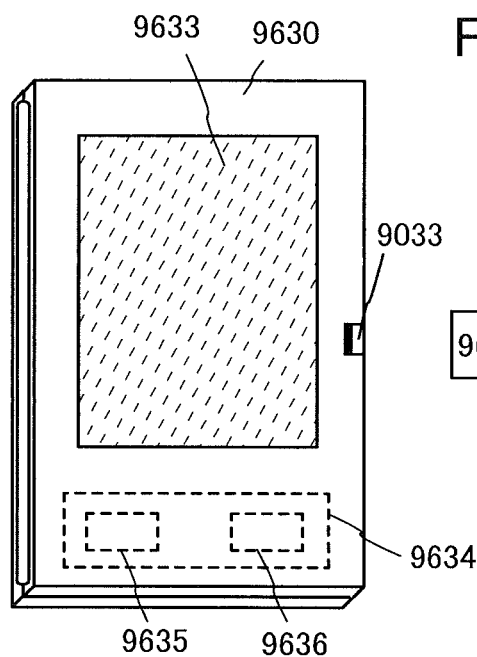

FIGS. 11A and 11B illustrate a foldable tablet terminal. The tablet terminal is opened in FIG. 11A. The tablet terminal includes a housing 9630, a display portion 9631a, a display portion 9631b, a display mode switch 9034, a power switch 9035, a power saver switch 9036, a clasp 9033, and an operation switch 9038.

In such a portable device illustrated in FIGS. 11A and 11B, a memory is used for temporarily storing image data or the like. For example, the semiconductor device described in Embodiment 2 or 3 can be used as a memory. By employing the semiconductor device described in the above embodiment for the memory, data can be written and read at high speed and held for a long time, and power consumption can be sufficiently reduced.

Part of the display portion 9631a can be a touch panel region 9632a and data can be input when a displayed operation key 9638 is touched. Although a structure in which a half region in the display portion 9631a has only a display function and the other half region also has a touch panel function is shown as an example, the display portion 9631a is not limited to the structure. The whole region in the display portion 9631a may have a touch panel function. For example, the display portion 9631a can display keyboard buttons in the whole region to be a touch panel, and the display portion 9631b can be used as a display screen.

As in the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal. In addition to the optical sensor, another detection device including a sensor for detecting inclination, such as a gyroscope or an acceleration sensor, may be incorporated in the tablet terminal.

Note that FIG. 11A shows an example in which the display portion 9631a and the display portion 9631b have the same display area; however, without limitation, one of the display portions may be different from the other display portion in size and display quality. For example, one display panel may be capable of higher-definition display than the other display panel.

The tablet terminal is closed in FIG. 11B. The tablet terminal includes the housing 9630, a solar cell 9633, a charge and discharge control circuit 9634, a battery 9635, and a DCDC converter 9636. In FIG. 11B, a structure including the battery 9635 and the DCDC converter 9636 is illustrated as an example of the charge and discharge control circuit 9634.

Since the tablet terminal is foldable, the housing 9630 can be closed when the tablet terminal is not used. As a result, the display portion 9631a and the display portion 9631b can be protected; thus, a tablet terminal which has excellent durability and excellent reliability in terms of long-term use can be provided.

In addition, the tablet terminal illustrated in FIGS. 11A and 11B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633 provided on a surface of the tablet terminal can supply power to the touch panel, the display portion, a video signal processing portion, or the like. Note that the solar cell 9633 can be provided on one or both surfaces of the housing 9630 and the battery 9635 can be charged efficiently. The use of a lithium ion battery as the battery 9635 is advantageous in downsizing or the like.

Figure 11C:
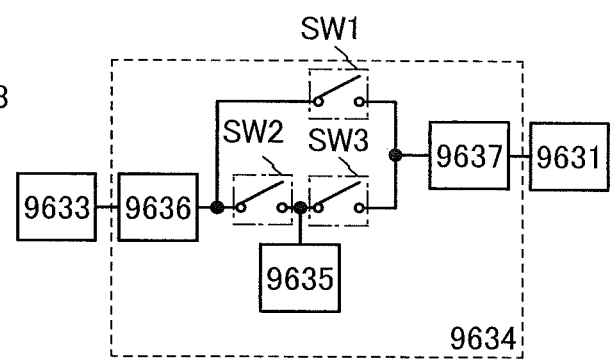

The structure and the operation of the charge and discharge control circuit 9634 illustrated in FIG. 11B will be described with reference to a block diagram in FIG. 11C. The solar cell 9633, the battery 9635, the DCDC converter 9636, a converter 9637, switches SW1 to SW3, and a display portion 9631 are illustrated in FIG. 11C, and the battery 9635, the DCDC converter 9636, the converter 9637, and the switches SW1 to SW3 correspond to the charge and discharge control circuit 9634 illustrated in FIG. 11B.

First, an example of the operation in the case where power is generated by the solar cell 9633 using external light is described. The voltage of power generated by the solar cell is stepped up or down by the DCDC converter 9636 so that the power has a voltage for charging the battery 9635. Then, when the power from the solar cell 9633 is used for the operation of the display portion 9631, the switch SW1 is turned on and the voltage of the power is stepped up or down by the converter 9637 so as to be a voltage needed for the display portion 9631. In addition, when display on the display portion 9631 is not performed, the switch SW1 is turned off and the switch SW2 is turned on so that the battery 9635 may be charged.

Note that the solar cell 9633 is described as an example of a power generation means; however, without limitation, the battery 9635 may be charged using another power generation means such as a piezoelectric element or a thermoelectric conversion element (Peltier element). For example, a non-contact electric power transmission module which transmits and receives power wirelessly (without contact) to charge the battery 9635, or a combination of the solar cell 9633 and another means for charge may be used.

Figure 12A:
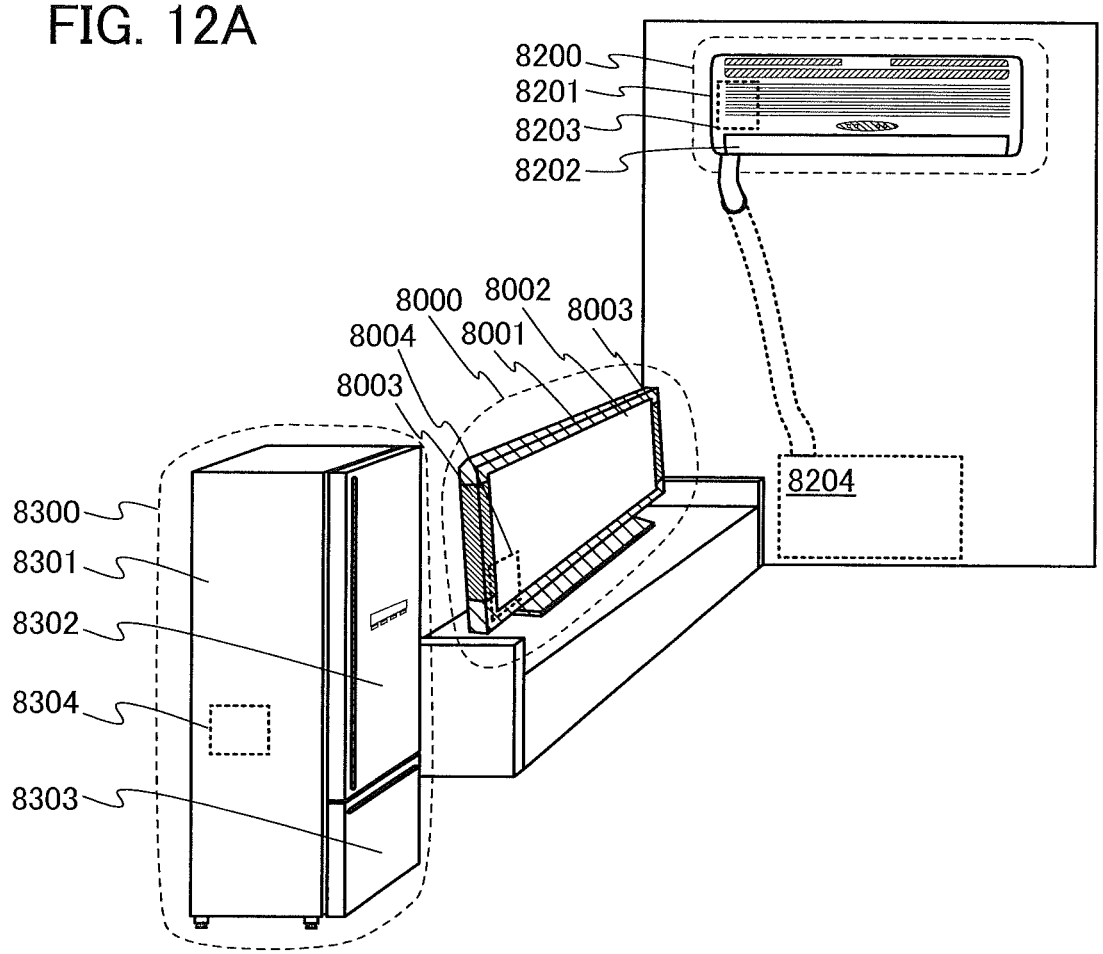
FIGS. 12A to 12C illustrate electronic devices.

In a television device 8000 in FIG. 12A, a display portion 8002 is incorporated in a housing 8001. The display portion 8002 displays an image and a speaker portion 8003 can output sound. The transistor described in Embodiment 1 can be used for the display portion 8002.

A semiconductor display device such as a liquid crystal display device, a light-emitting device in which a light-emitting element such as an organic EL element is provided in each pixel, an electrophoresis display device, a digital micromirror device (DMD), a plasma display panel (PDP), or the like can be used in the display portion 8002.

The television device 8000 may be provided with a receiver, a modem, and the like. With the receiver, the television device 8000 can receive general television broadcasting. Furthermore, when the television device 8000 is connected to a communication network by wired or wireless connection via the modem, one-way (from a transmitter to a receiver) or two-way (between a transmitter and a receiver, between receivers, or the like) data communication can be performed.

In addition, the television device 8000 may include a CPU for performing information communication or a memory. The memory and the CPU described in any of Embodiments 2 to 5 can be used in the television device 8000.

In FIG. 12A, an air conditioner including an indoor unit 8200 and an outdoor unit 8204 is an example of an electronic device including the CPU of Embodiment 4. Specifically, the indoor unit 8200 includes a housing 8201, a ventilation duct 8202, a CPU 8203, and the like. FIG. 12A shows the case where the CPU 8203 is provided in the indoor unit 8200; the CPU 8203 may be provided in the outdoor unit 8204. Alternatively, the CPU 8203 may be provided in both the indoor unit 8200 and the outdoor unit 8204. Since the CPU described in Embodiment 4 is formed using an oxide semiconductor, an air conditioner which has excellent heat resistance property and high reliability can be provided with the use of the CPU.

In FIG. 12A, an electric refrigerator-freezer 8300 is an example of an electronic device which is provided with the CPU formed using an oxide semiconductor. Specifically, the electric refrigerator-freezer 8300 includes a housing 8301, a refrigerator door 8302, a freezer door 8303, a CPU 8304, and the like. The CPU 8304 is provided in the housing 8301 in FIG. 12A. When the CPU described in Embodiment 4 is used as the CPU 8304 of the electric refrigerator-freezer 8300, power saving can be achieved.

Figure 12B:
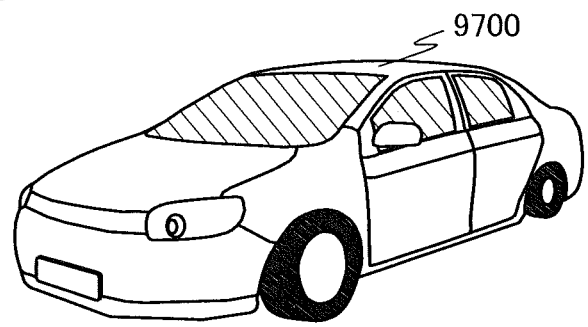
Figure 12C:
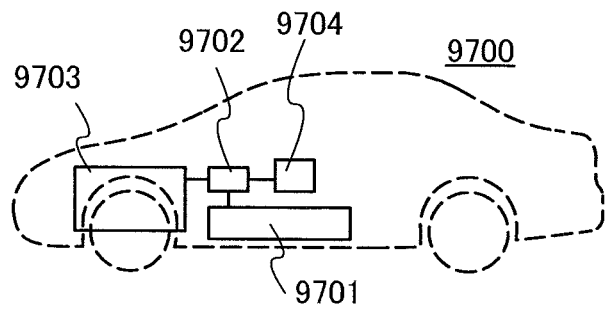

FIG. 12B illustrates an example of an electric vehicle which is an example of an electronic device. FIG. 12C schematically illustrates the inside of the electric vehicle. An electric vehicle 9700 is equipped with a secondary battery 9701. The output of power of the secondary battery 9701 is controlled by a control circuit 9702 and the power is supplied to a driving device 9703. The control circuit 9702 is controlled by a processing unit 9704 including a ROM, a RAM, a CPU, or the like which is not illustrated. When the memory and the CPU described in any of Embodiments 2 to 5 are used for the electric vehicle 9700, power saving can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

Note that any of the electronic devices described above may be directly supplied with power by a power supply unit such as a solar cell, a piezoelectric element, a thermoelectric conversion element, or a non-contact power transmission module. Alternatively, any of the electronic devices described above may be supplied with power through a power storage device.

This embodiment can be implemented in appropriate combination with any of the structures described in the other embodiments.

Reference Example 1

The transistor structure disclosed in this specification is useful for a structure in which a channel formation region is formed in a CAAC-OS film. Hereinafter, the feature of an CAAC-OS film that oxygen is easily diffused in the lateral direction will be described.

Here, as an example of the oxide semiconductor film, ease of excessive oxygen (oxygen atoms in excess of those in the stoichiometric composition) transfer and ease of oxygen vacancy transfer in an In—Ga—Zn-based oxide (hereinafter, referred to as IGZO) film are described with reference to scientific calculation results.

Note that the calculation was performed in such a manner that models in which one excessive oxygen or oxygen vacancy existed in an In—O plane of IGZO with an atomic ratio of In:Ga:Zn=3:1:2 were made by geometry optimization (see FIGS. 13A to 13C and FIGS. 15A to 15C), and energy to an intermediate structure along a minimum energy path in each model was calculated by a nudged elastic band (NEB) method.

The calculation was performed using calculation program software "OpenMX" based on the density functional theory (DFT). Parameters are described below.

As a basis function, a pseudo-atomic localized basis function was used. The basis function is classified as polarization basis sets STO (slater type orbital).

As a functional, generalized-gradient-approximation/Perdew-Burke-Emzerhof (GGAIPBE) was used.

The cut-off energy was 200 Ry.

The sampling point k was 5×5×3.

In the calculation of ease of excessive oxygen transfer, the number of atoms which existed in the calculation model was set to 85. In the calculation of ease of oxygen vacancy transfer, the number of atoms which existed in the calculation model was set to 83.

Ease of excessive oxygen transfer and ease of oxygen vacancy transfer are evaluated by calculation of a height of energy barrier Eb which is required to go over in moving to respective sites. That is, when the height of energy barrier Eb which is gone over in moving is high, excessive oxygen or oxygen vacancy hardly moves, and when the height of the energy barrier Eb is low, excessive oxygen or oxygen vacancy easily moves.

Figure 14:
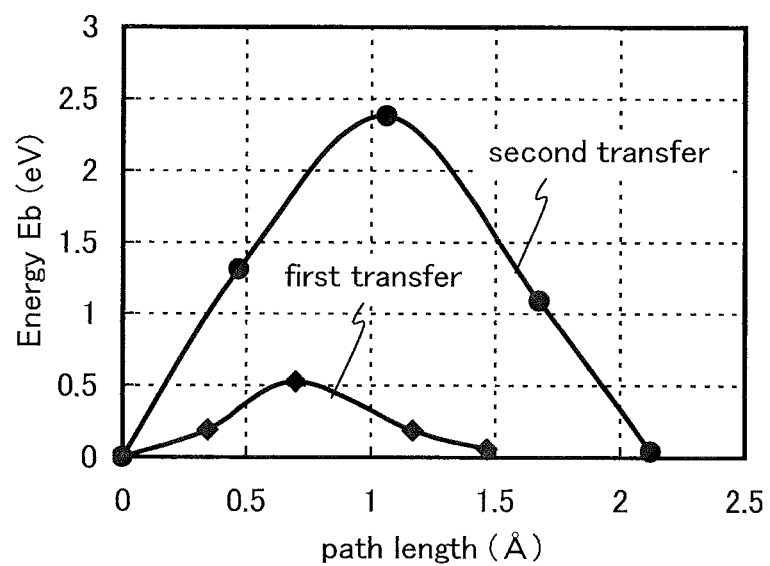
FIG. 14 shows calculation results of the models in FIGS. 13A to 13C.

First, the movement of excessive oxygen is described. FIGS. 13A to 13C show models used in calculation of the movement of excessive oxygen. Note that the longitudinal direction in each of the models corresponds to a c-axis of crystal axes. The calculations of two transfer patterns described below were performed. FIG. 14 shows the calculation results. In FIG. 14, the horizontal axis represents a path length (for the movement of excessive oxygen) and the vertical axis represents energy (which is needed for the movement) with respect to energy in a state of Model A in FIG. 13A.

Of the two transfer patterns in the case of the movement of the excessive oxygen, the first transfer is the one from Model A to Model B. The second transfer is the one from Model A to Model C.

In FIGS. 13A to 13C, an oxygen atom denoted by "1" is referred to as a first oxygen atom of Model A; an oxygen atom denoted by "2" is referred to as a second oxygen atom of Model A; and an oxygen atom denoted by "3" is referred to as a third oxygen atom of Model A.

As seen from FIG. 14, the maximum value ($Eb_{max}$) of the height Eb of the energy barrier in the first transfer is 0.53 eV, and that in the second transfer is 2.38 eV. That is, the maximum value ($Eb_{max}$) of the height Eb of the energy barrier in the first transfer is lower than that in the second transfer. Therefore, energy required for the first transfer is lower than energy required for the second transfer, and the first transfer occurs more easily than the second transfer.

That is, the first oxygen atom of Model A moves in the direction in which the second oxygen atom of Model A is pushed more easily than in the direction in which the third oxygen atom of Model A is pushed. Therefore, this shows that the oxygen atom moves along the layer of indium atoms more easily than across the layer of indium atoms.

Figure 15A:
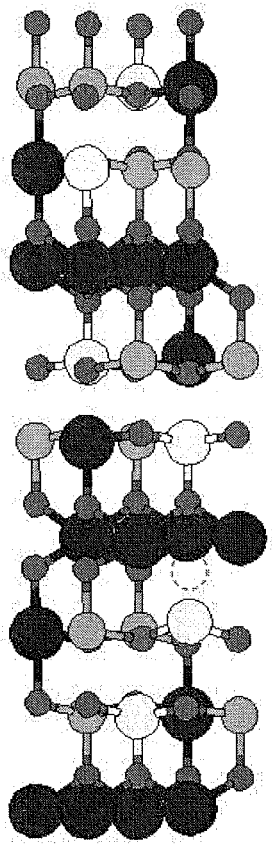
FIGS. 15A to 15C are model diagrams used for calculation of movement of oxygen vacancy.
Figure 15B:
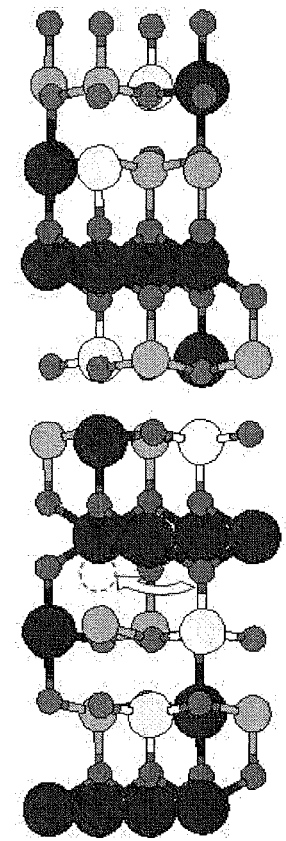
Figure 15C:
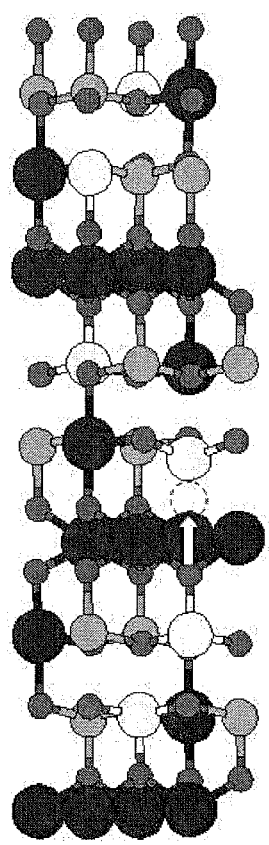
Figure 16:
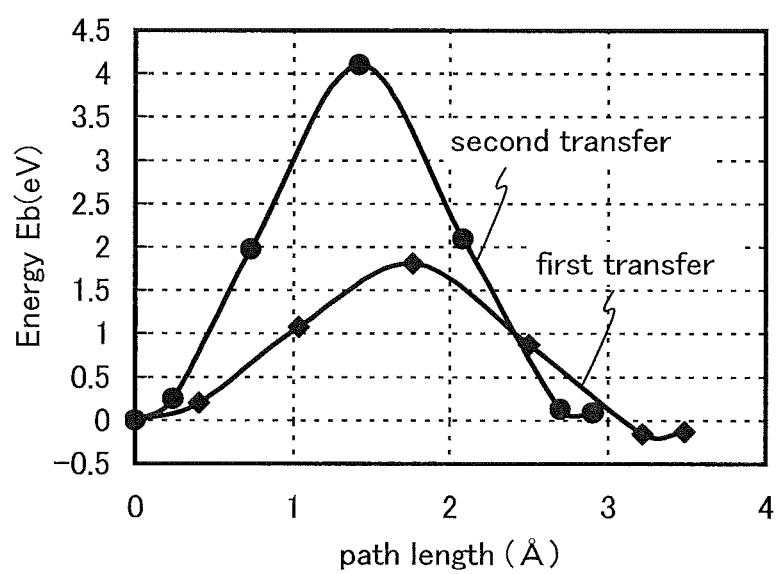
FIG. 16 shows calculation results of the models in FIGS. 15A to 15C.

Next, the movement of oxygen vacancy is described. FIGS. 15A to 15C show models used in calculation of the movement of oxygen vacancy. The calculations of two transfer patterns described below were performed. FIG. 16 shows the calculation results. In FIG. 16, the horizontal axis represents a path length (for the movement of oxygen vacancy) and the vertical axis represents energy (which is needed for the movement) with respect to energy in a state of Model A in FIG. 15A.

Of the two transfer patterns in the case of the movement of the oxygen vacancy, the first transfer is the one from Model A to Model B. The second transfer is the one from Model A to Model C.

Note that dashed circles in FIGS. 15A to 15C represent oxygen vacancy.

As seen from FIG. 16, the maximum value ($Eb_{max}$) of the height Eb of the energy barrier in the first transfer is 1.81 eV, and that in the second transfer is 4.10 eV. That is, the maximum value ($Eb_{max}$) of the height Eb of the energy barrier in the first transfer is lower than that in the second transfer. Therefore, energy required for the first transfer is lower than energy required for the second transfer, and the first transfer occurs more easily than the second transfer.

That is, the oxygen vacancy of Model A moves to the position of oxygen vacancy of Model B more easily than to the position of oxygen vacancy of Model C. Therefore, this shows that the oxygen vacancy also moves along the layer of indium atoms more easily than across the layer of indium atoms.

Next, in order to compare probabilities of occurrence of the above-described four transfer patterns from another side, temperature dependence of each of these transfers is described. The above-described four transfer patterns are (1) the first transfer of excessive oxygen, (2) the second transfer of excessive oxygen, (3) the first transfer of oxygen vacancy, and (4) the second transfer of oxygen vacancy.

Temperature dependences of these transfers are compared with each other based on movement frequency per unit time. Here, movement frequency Z (per second) at certain temperature T (K) is represented by Formula (1) when the number of vibrations Zo (per second) of an oxygen atom in the chemically stable position is used.

$$Z = Zo \cdot \exp\left(-\frac{Eb_{max}}{kT}\right) \qquad (1)$$

Note that $Eb_{max}$ represents the maximum value of the height Eb of the energy barrier in each transfer and k represents Boltzmann constant in Formula (1). Further, $Zo=1.0\times10^{13}$ (per second) is used for the calculation.

In the case where the excessive oxygen or the oxygen vacancy moves beyond the maximum value ($Eb_{max}$) of the height Eb of the energy barrier once per second (in the case of Z=1 (per second)), when Formula (1) is solved for T, the following are obtained.

(1) The first transfer of excessive oxygen: T=206 K (−67° C.) in the case of Z=1.

(2) The second transfer of excessive oxygen: T=923 K (650° C.) in the case of Z=1.

(3) The first transfer of oxygen vacancy: T=701 K (428° C.) in the case of Z=1.

(4) The second transfer of oxygen vacancy: T=1590 K (1317° C.) in the case of Z=1.

On the other hand, when Formula (1) is solved for Z in the case of T=300 K (27° C.), the following are obtained.

(1) The first transfer of excessive oxygen: $Z=1.2\times10^{4}$ (per second) in the case of T=300 K.

(2) The second transfer of excessive oxygen: $Z=1.0\times10^{-27}$ (per second) in the case of T=300 K.

(3) The first transfer of oxygen vacancy: $Z=4.3\times10^{-18}$ (per second) in the case of T=300 K.

(4) The second transfer of oxygen vacancy: $Z=1.4\times10^{-56}$ (per second) in the case of T=300 K.

Further, when Formula (1) is solved for Z in the case of T=723 K (450° C.), the following are obtained.

(1) The first transfer of excessive oxygen: $Z=2.0\times10^9$ (per second) in the case of T=723 K.
(2) The second transfer of excessive oxygen: $Z=2.5\times10^{-4}$ (per second) in the case of T=723 K.
(3) The first transfer of oxygen vacancy: Z=2.5 (per second) in the case of T=723 K.
(4) The second transfer of oxygen vacancy: $Z=2.5\times10^{-16}$ (per second) in the case of T=723 K.

In view of the above-described calculation, excessive oxygen, in the case of either T=300 K or T=723 K, moves along the layer of indium atoms more easily than across the layer of indium atoms. Moreover, oxygen vacancy also, in the case of either T=300 K or T=723 K, moves along the layer of indium atoms more easily than across the layer of indium atoms.

Further, in the case of T=300 K, the movement of excessive oxygen along the layer of indium atoms occurs extremely easily; however, the other transfers do not occur easily. In the case of T=723 K, not only the movement of excessive oxygen along the layer of indium atoms but the movement of oxygen vacancy along the layer of indium atoms occurs easily; however, it is difficult for either the excessive oxygen or the oxygen vacancy to move across the layer of indium atoms.

That is, it can be said that in the case where the layer of indium atoms exists in a plane parallel to a surface where a film is formed or a surface of the film (e.g., the case of a CAAC-OS film), excessive oxygen and oxygen vacancy easily move in a parallel direction to the surface where the film is formed or the surface of the film.

As described above, in the CAAC-OS film, excessive oxygen easily move along a surface where the CAAC-OS film is formed or a surface of the CAAC-OS film. For that reason, in the case where a channel formation region is formed in a CAAC-OS film in a transistor, diffusion of oxygen from the direction horizontal to the channel formation region (from a source region and a drain region) is easier than from the direction perpendicular to the channel formation region (from a base insulating film and a gate insulating film)

Note that the case where the excessive oxygen or the oxygen vacancy moves across the layer of indium atoms is described above; however, the present invention is not limited thereto, and the same applies to metals other than indium which are contained in an oxide semiconductor film.

This application is based on Japanese Patent Application serial no. 2012-040837 filed with Japan Patent Office on Feb. 28, 2012, the entire contents of which are hereby incorporated by reference.

What is claimed is:

1. A method for manufacturing a semiconductor device with a single-gate transistor, comprising the steps of:
   forming an oxide semiconductor layer containing indium and zinc over an insulating surface;
   forming a source electrode and a drain electrode in contact with part of the oxide semiconductor layer;
   forming a gate insulating film over the oxide semiconductor layer, the source electrode, and the drain electrode; and
   adding oxygen to the oxide semiconductor layer in a region that does not overlap with the source electrode and the drain electrode after the formation of the gate insulating film, wherein the oxygen is added by an ion implantation method, an ion doping method or a plasma immersion ion implantation method.

2. The method for manufacturing the semiconductor device according to claim 1,
   wherein the oxide semiconductor layer is formed by a sputtering method, a molecular beam epitaxy method, a CVD method, a pulse laser deposition method, or an atomic layer deposition method.

3. A method for manufacturing a semiconductor device with a single-gate transistor, comprising the steps of:
   forming an oxide semiconductor layer containing indium and zinc over an insulating surface;
   forming an electrode in contact with part of the oxide semiconductor layer;
   forming a silicon oxynitride film over the oxide semiconductor layer and the electrode; and
   adding oxygen to the oxide semiconductor layer in a region that does not overlap with the electrode after the formation of the silicon oxynitride film, wherein the oxygen is added by an ion implantation method, an ion doping method or a plasma immersion ion implantation method.

4. The method for manufacturing the semiconductor device according to claim 3,
   wherein the oxide semiconductor layer is formed by a sputtering method, a molecular beam epitaxy method, a CVD method, a pulse laser deposition method, or an atomic layer deposition method.

* * * * *